(12) United States Patent
Yen

(10) Patent No.: US 10,755,994 B2
(45) Date of Patent: Aug. 25, 2020

(54) SEMICONDUCTOR PACKAGE STRUCTURE AND SEMICONDUCTOR SUBSTRATE

(71) Applicant: Advanced Semiconductor Engineering, Inc., Kaohsiung (TW)

(72) Inventor: You-Lung Yen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/173,974

(22) Filed: Oct. 29, 2018

(65) Prior Publication Data

US 2020/0135604 A1 Apr. 30, 2020

(51) Int. Cl.
| | |
|---|---|
| *H01L 23/495* | (2006.01) |
| *H01L 23/31* | (2006.01) |
| *H01L 21/56* | (2006.01) |
| *H01L 21/48* | (2006.01) |
| *H01L 23/498* | (2006.01) |

(52) U.S. Cl.
CPC ...... *H01L 23/3135* (2013.01); *H01L 21/4846* (2013.01); *H01L 21/56* (2013.01); *H01L 23/3128* (2013.01); *H01L 23/49838* (2013.01)

(58) Field of Classification Search
CPC ............... H01L 23/12; H01L 23/49822; H01L 23/49838
See application file for complete search history.

(56) References Cited

U.S. PATENT DOCUMENTS

| | | | |
|---|---|---|---|
| 8,367,475 B2 | 2/2013 | Law et al. | |
| 9,451,700 B2 | 9/2016 | Otsubo | |
| 9,818,684 B2 | 11/2017 | Hiner et al. | |
| 2009/0229868 A1* | 9/2009 | Tsukada | H05K 3/4661 174/258 |
| 2010/0123257 A1* | 5/2010 | Liu | H01L 23/5389 257/777 |
| 2013/0181342 A1 | 7/2013 | Park | |
| 2015/0136451 A1* | 5/2015 | Park | H01L 23/49811 174/255 |
| 2015/0155214 A1* | 6/2015 | Lim | H01L 23/49838 174/251 |
| 2016/0133537 A1* | 5/2016 | Shih | H01L 24/83 257/762 |
| 2016/0338202 A1* | 11/2016 | Park | H01L 23/5389 |
| 2017/0005029 A1* | 1/2017 | Bang | H01L 23/3114 |
| 2017/0160313 A1* | 6/2017 | Koiwa | G01R 15/20 |
| 2017/0338128 A1* | 11/2017 | Huang | H01L 21/561 |
| 2019/0051590 A1* | 2/2019 | Fang | H01L 23/49827 |
| 2019/0131285 A1* | 5/2019 | Kim | H01L 24/19 |

* cited by examiner

*Primary Examiner* — Phuc T Dang
(74) *Attorney, Agent, or Firm* — Foley & Lardner LLP

(57) ABSTRACT

A semiconductor package structure includes a patterned conductive layer with a front surface, a back surface, and a side surface connecting the front surface and the back surface. The semiconductor package structure further includes a first semiconductor chip on the front surface and electrically connected to the patterned conductive layer, a first encapsulant covering at least the back surface of the patterned conductive layer, and a second encapsulant covering at least the front surface of the patterned conductive layer, the side surface being covered by one of the first encapsulant and the second encapsulant.

20 Claims, 26 Drawing Sheets

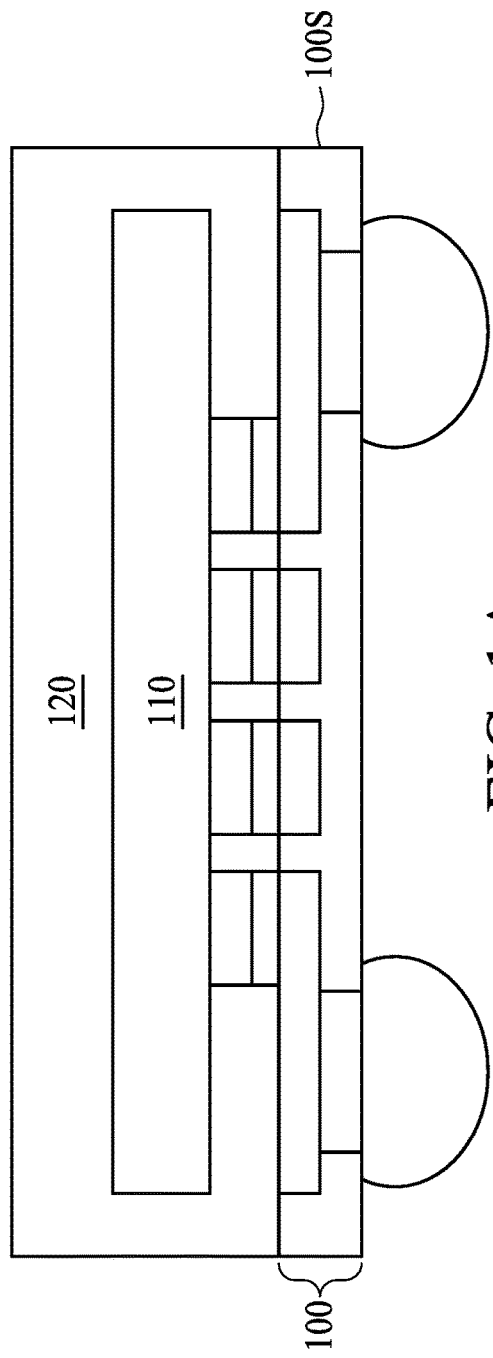
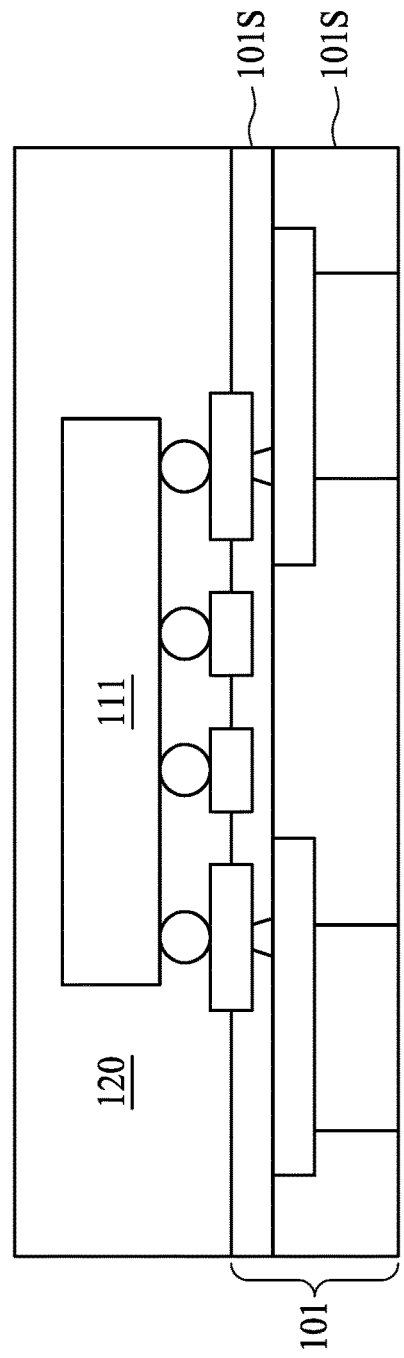
FIG. 1A
FIG. 1B

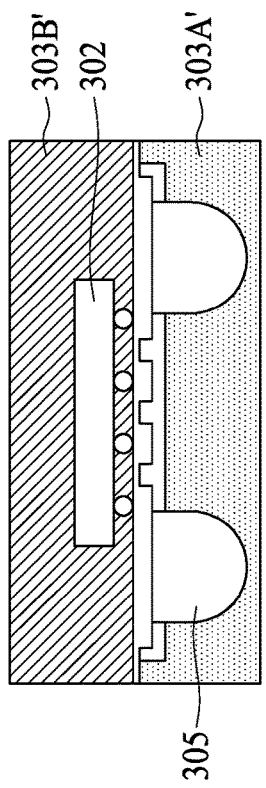
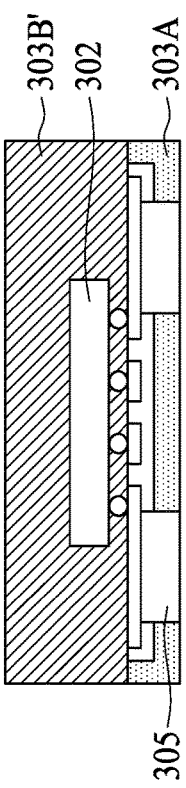
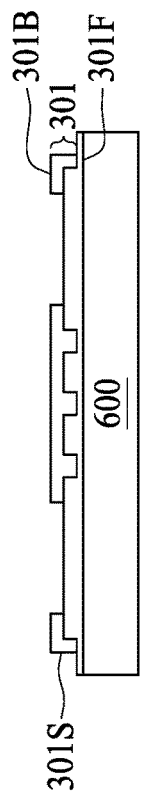
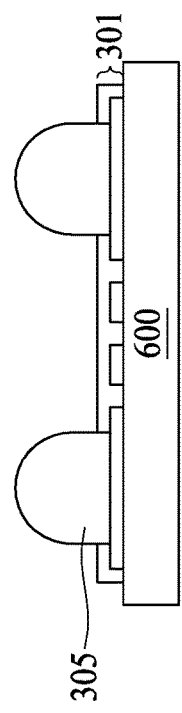
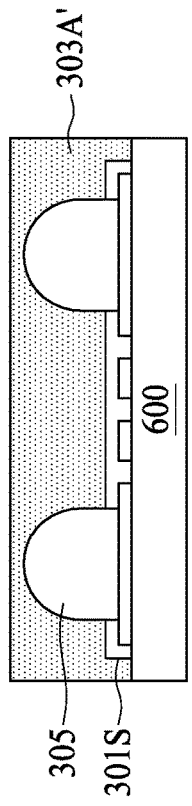
FIG. 6A  FIG. 6B  FIG. 6C  FIG. 6D  FIG. 6E  FIG. 6F

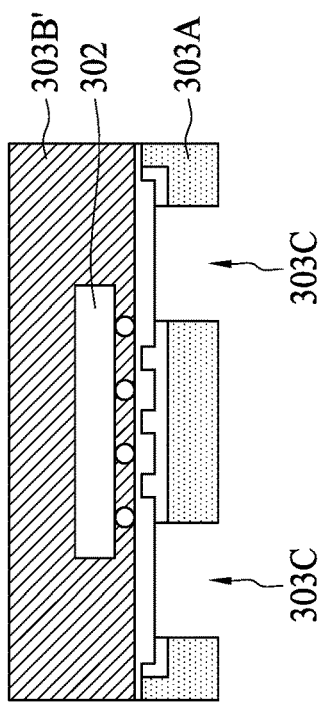
FIG. 7A
FIG. 7B
FIG. 7C
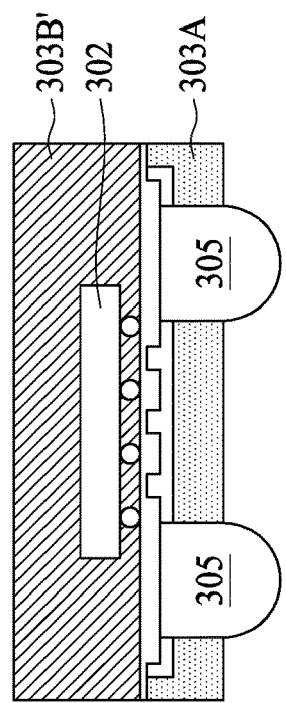
FIG. 7D
FIG. 7E

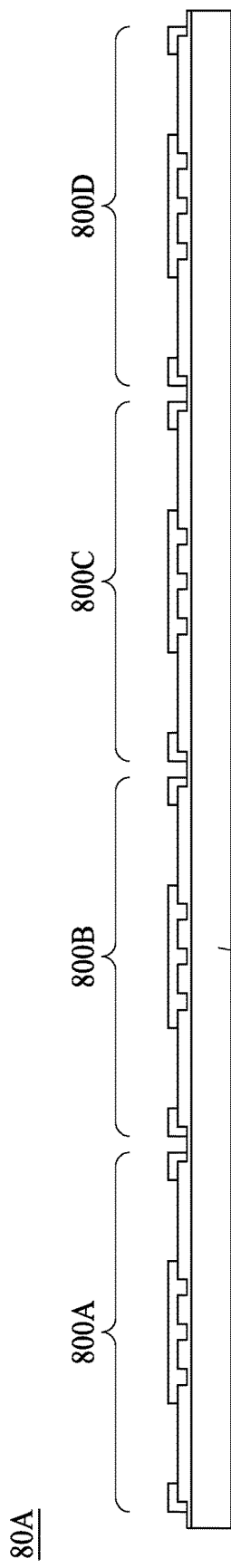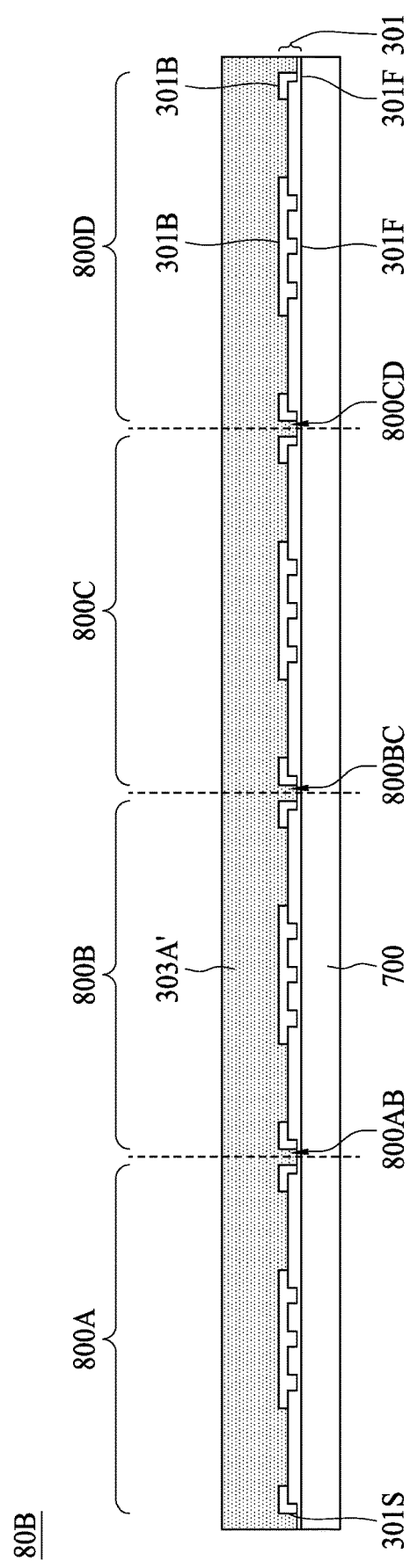

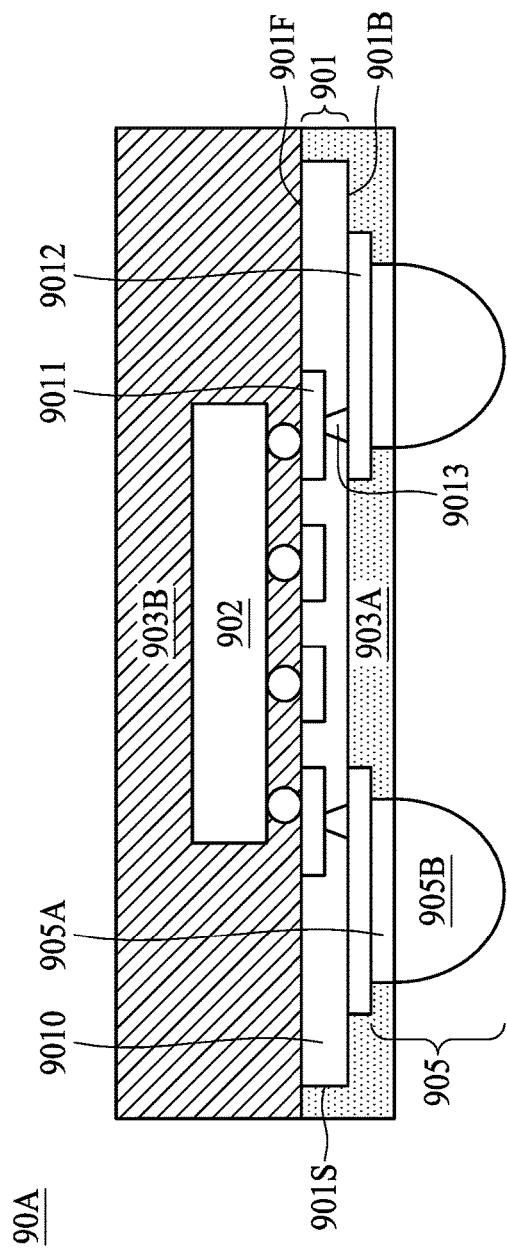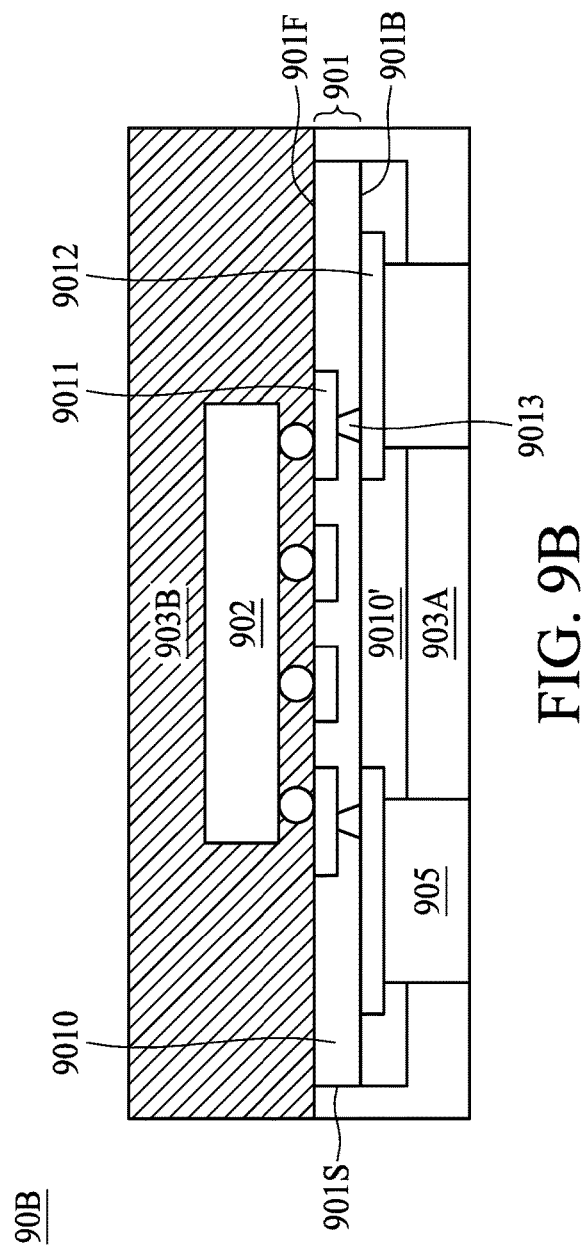

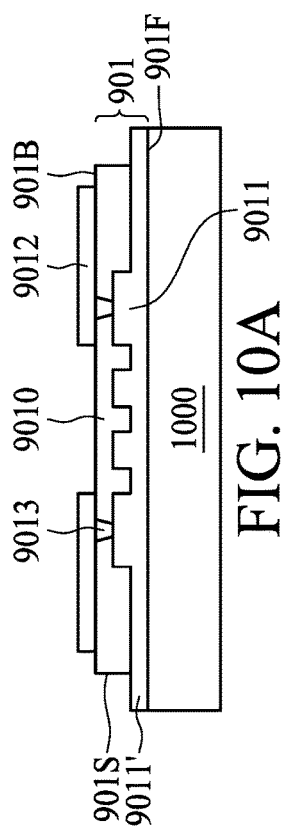
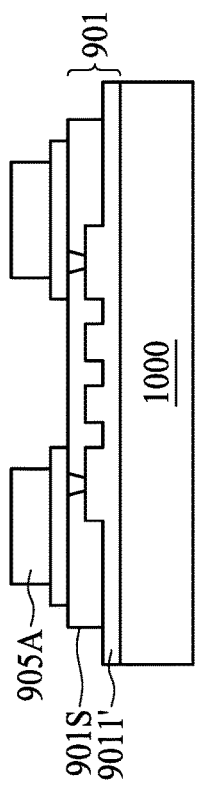
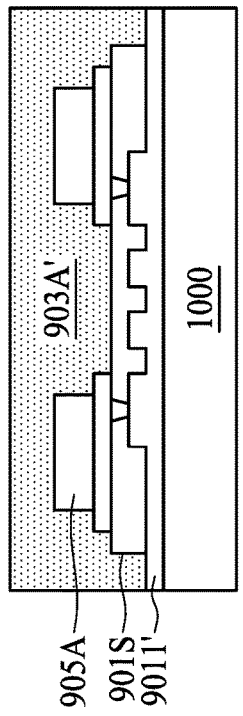
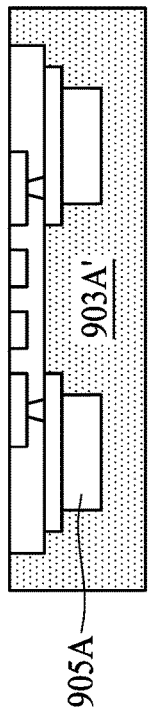
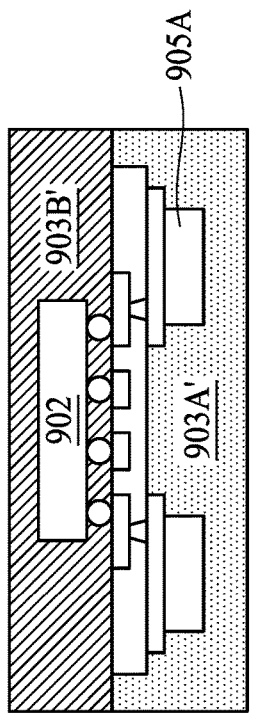
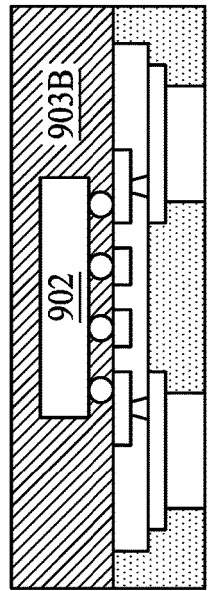
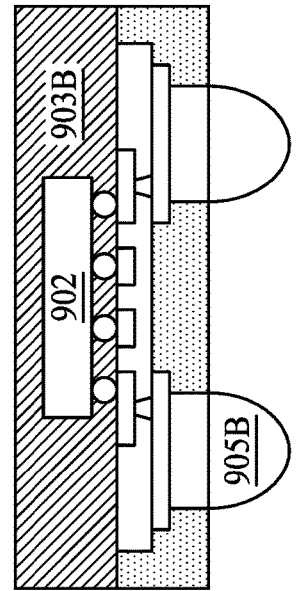

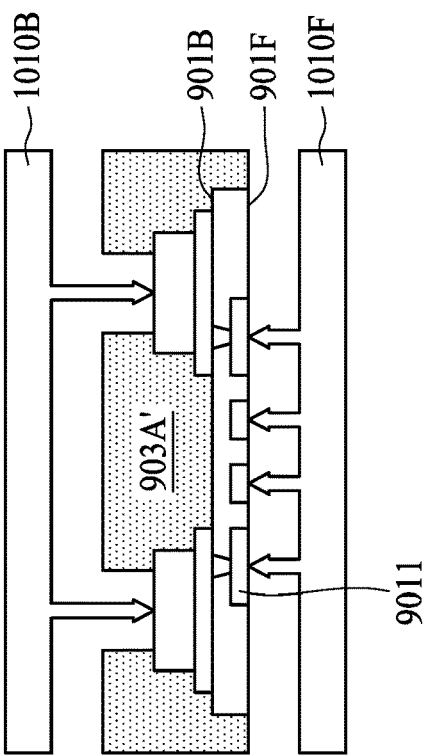
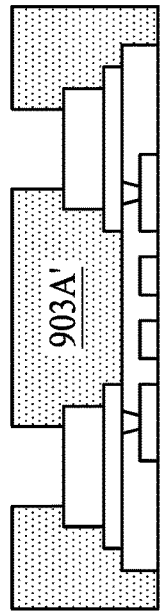
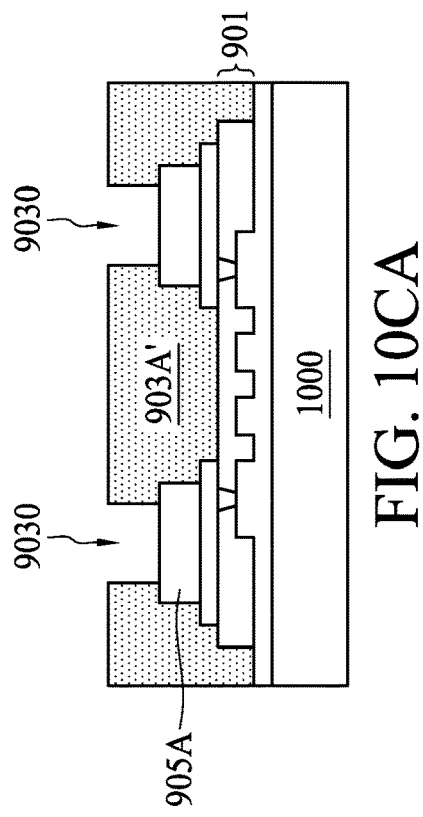
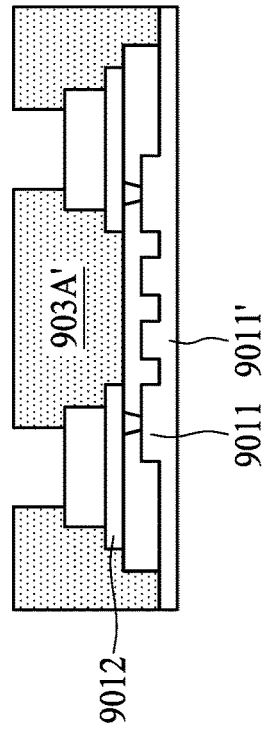
FIG. 10CC
FIG. 10CD
FIG. 10CA
FIG. 10CB

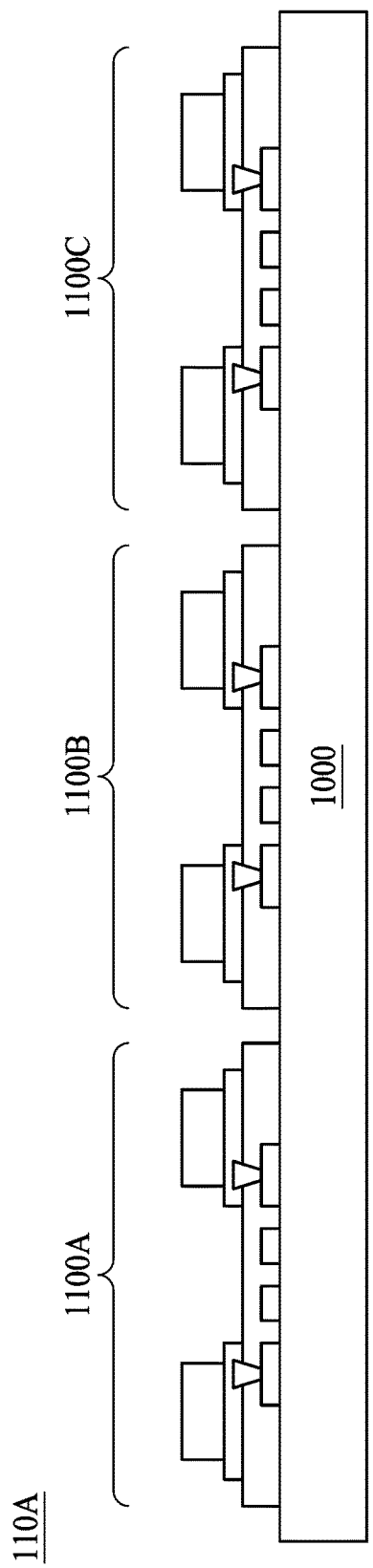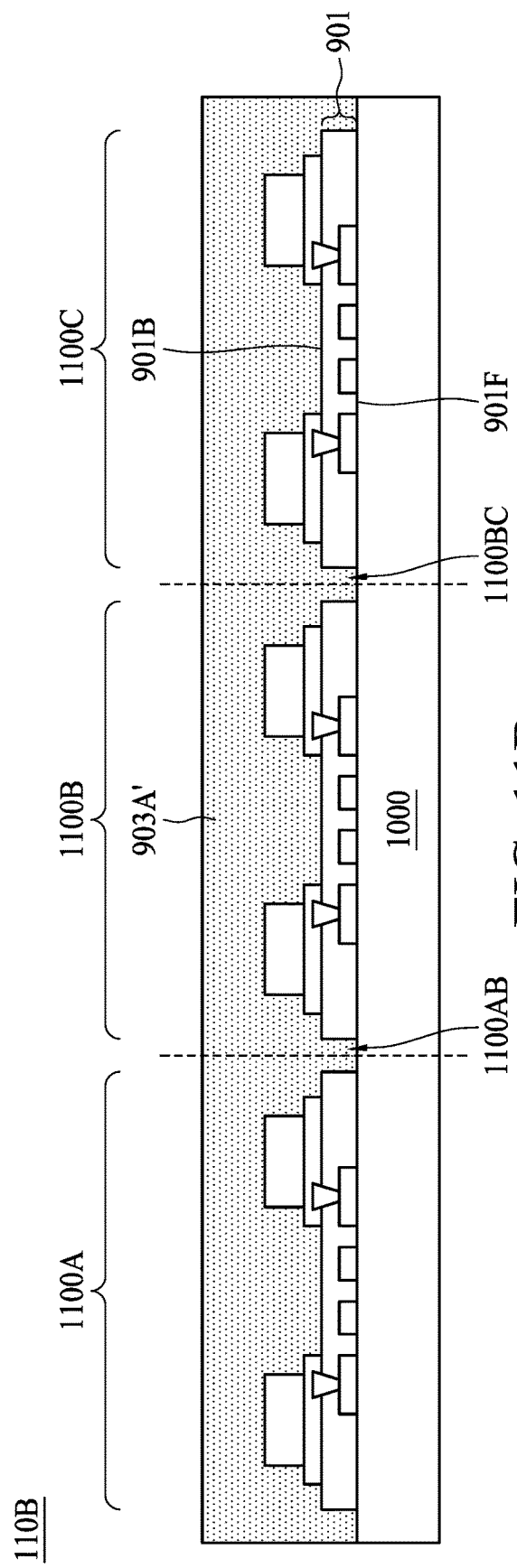

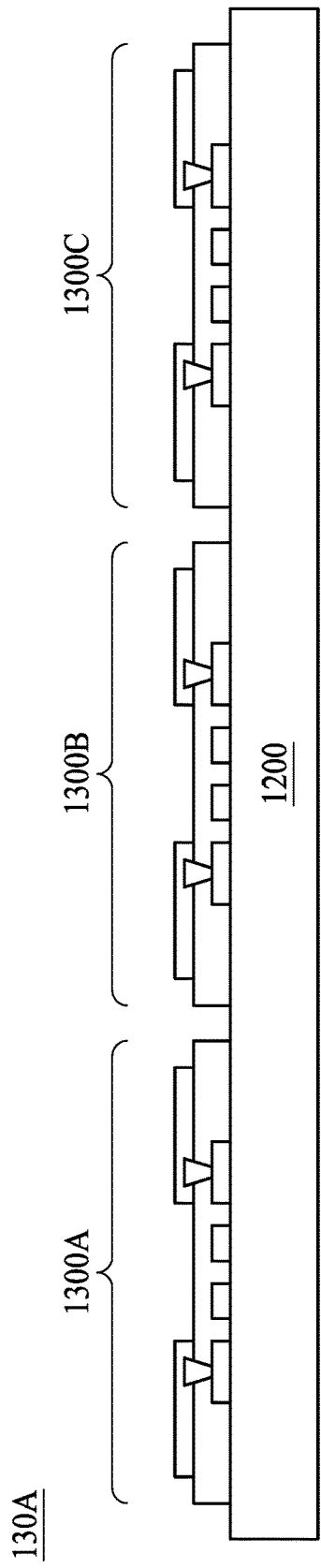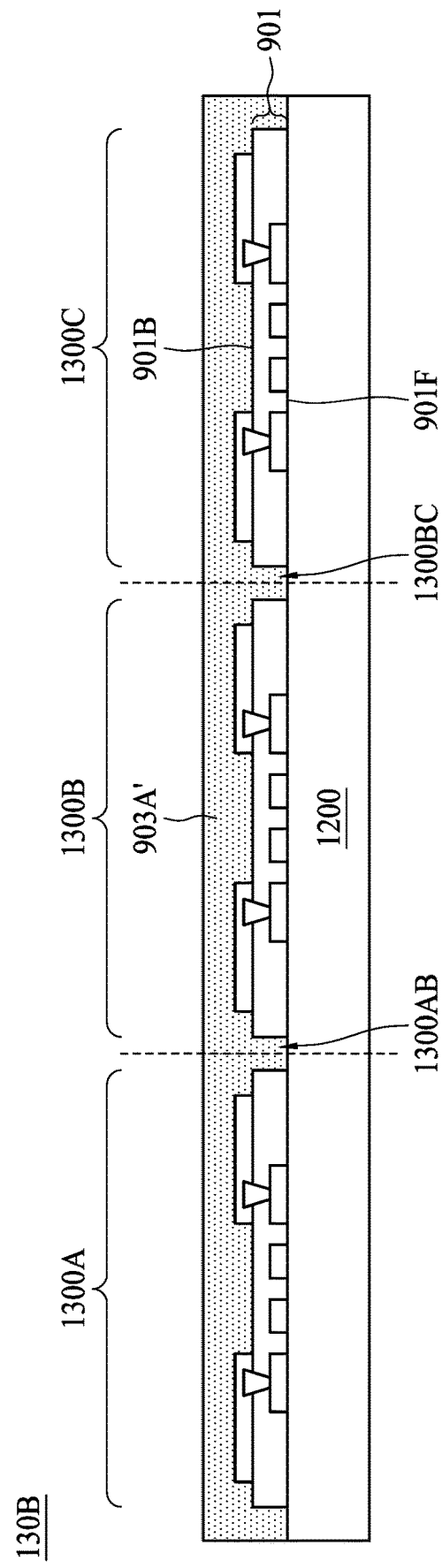

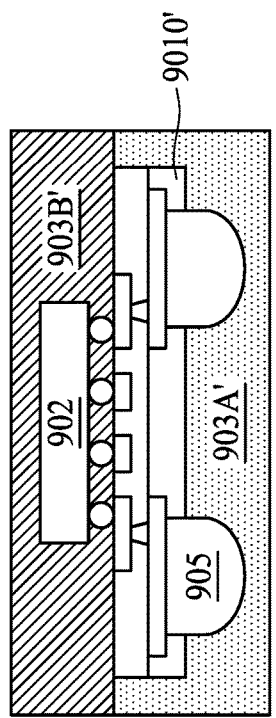
FIG. 14E
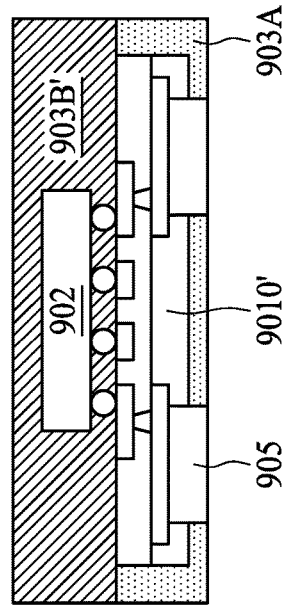
FIG. 14F
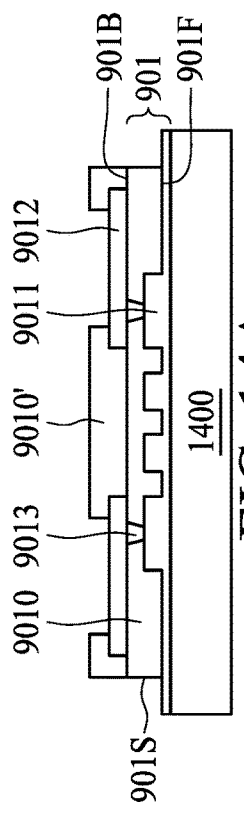
FIG. 14A
FIG. 14B
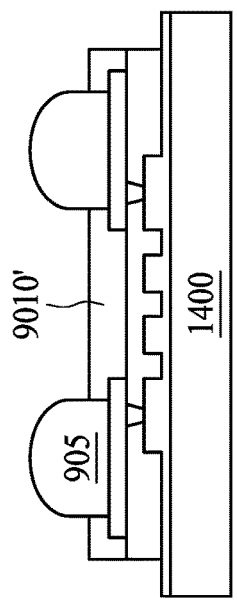
FIG. 14C
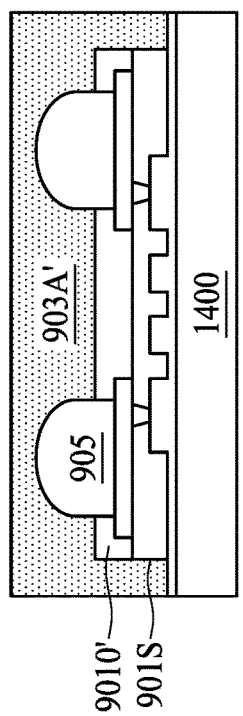
FIG. 14D
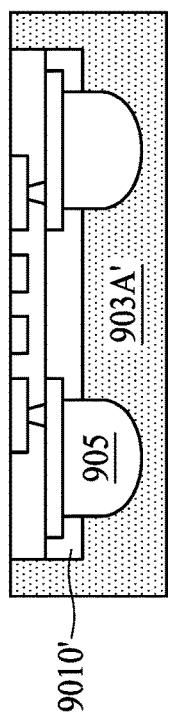

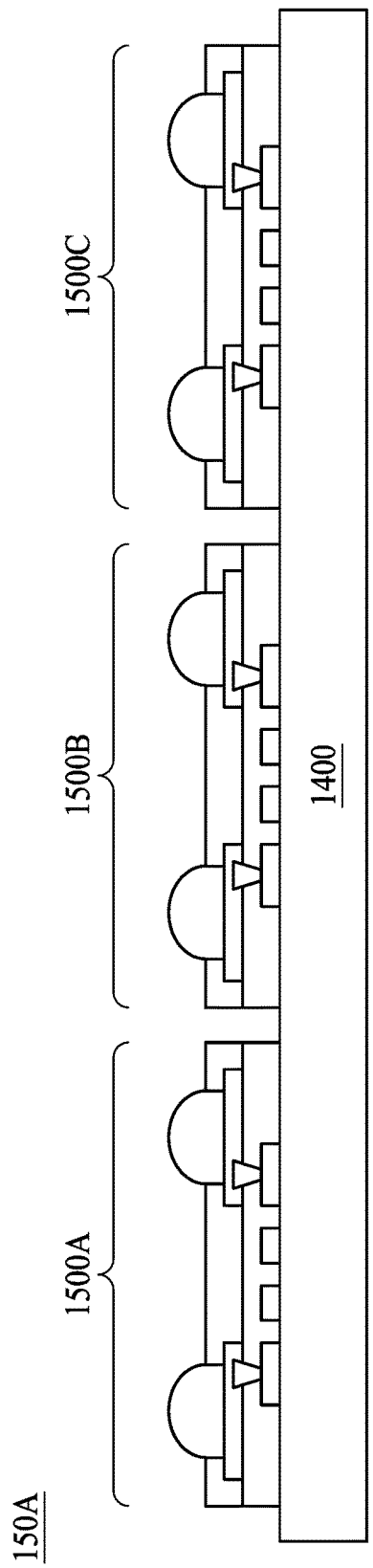
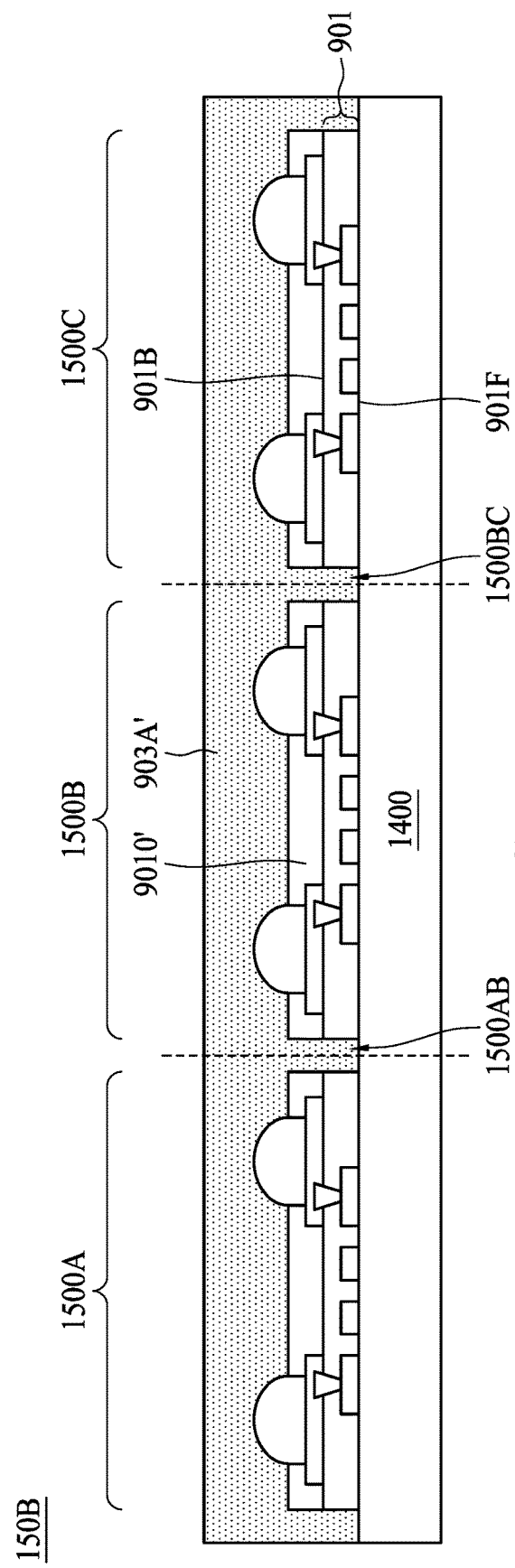
FIG. 15A
FIG. 15B

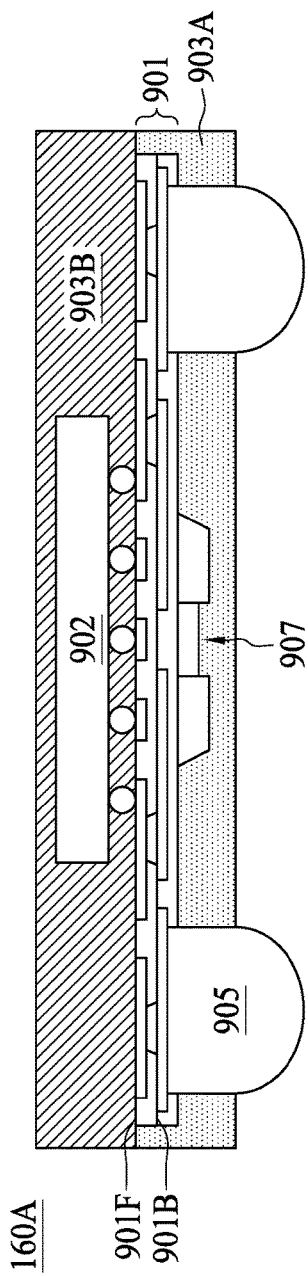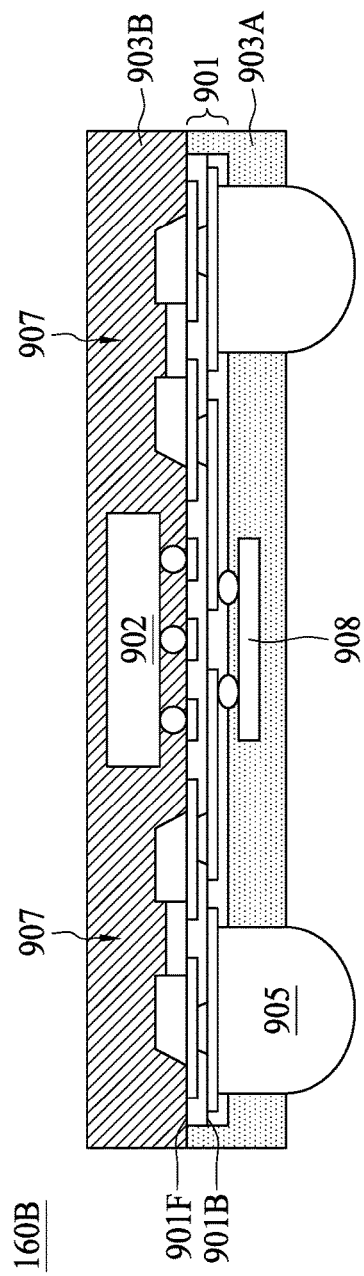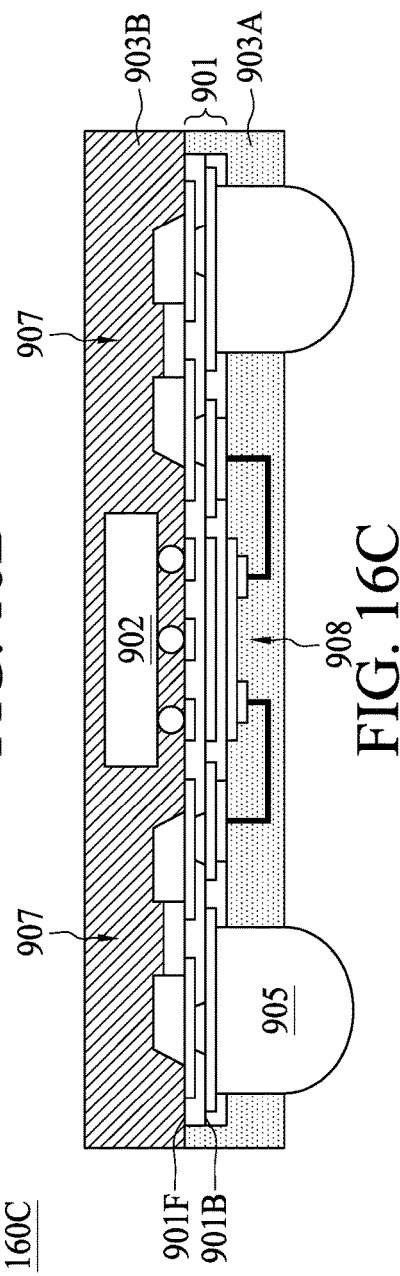

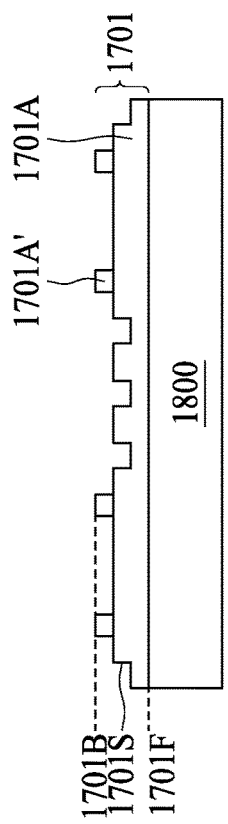
FIG. 18A
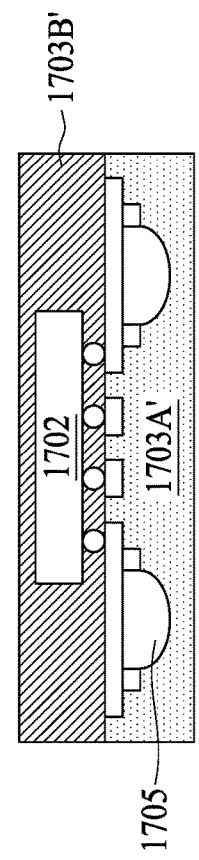
FIG. 18E
FIG. 18B
FIG. 18F
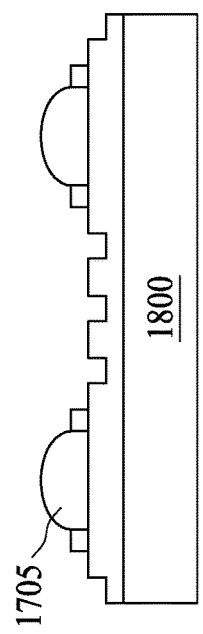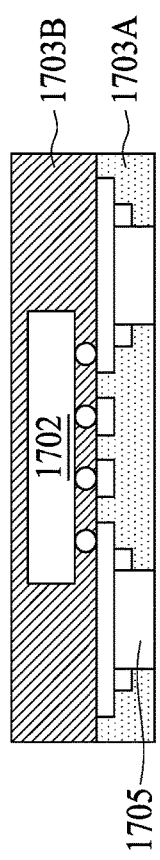
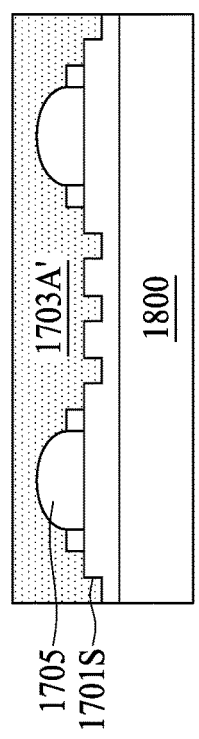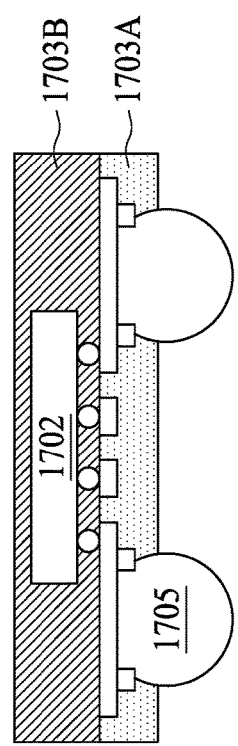
FIG. 18C
FIG. 18G
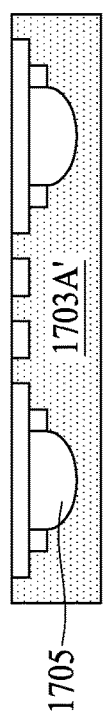
FIG. 18D

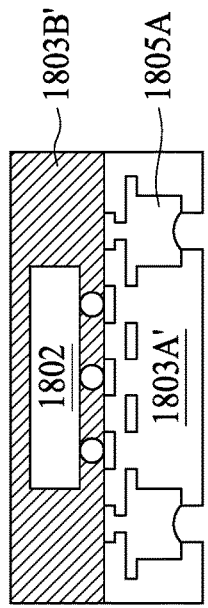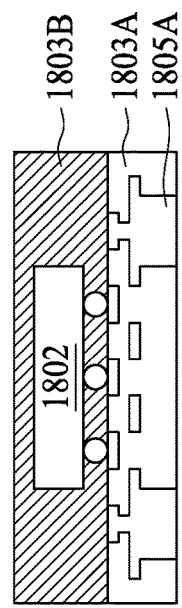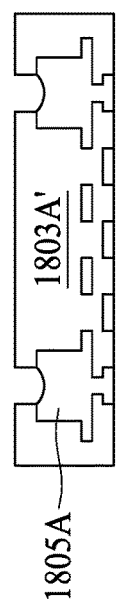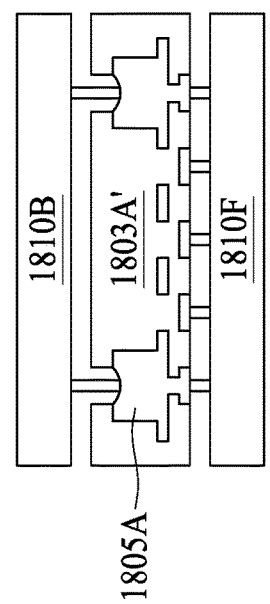
FIG. 18EE   FIG. 18FF   FIG. 18GG
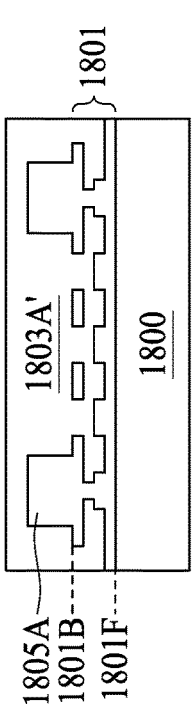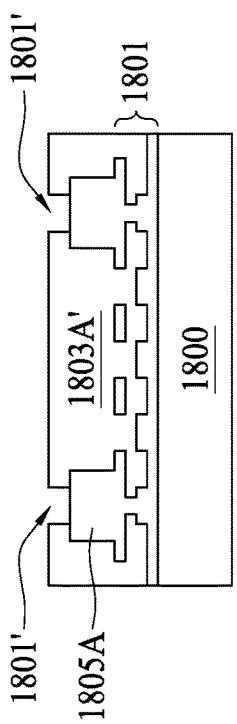
FIG. 18AA   FIG. 18BB   FIG. 18CC   FIG. 18DD

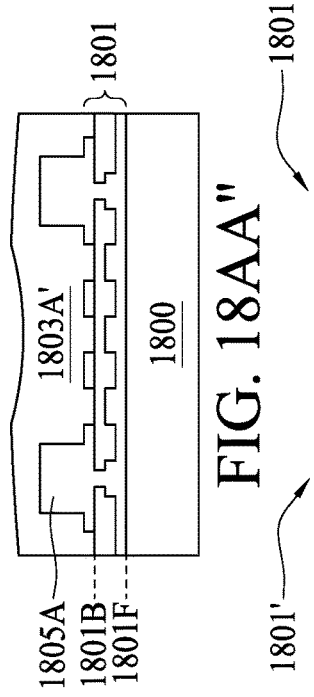
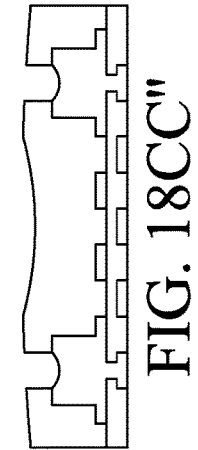
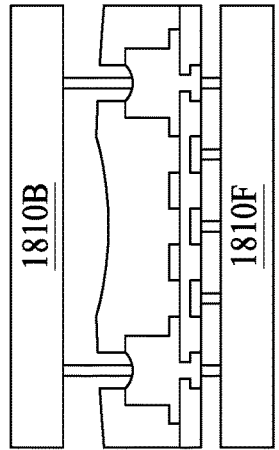
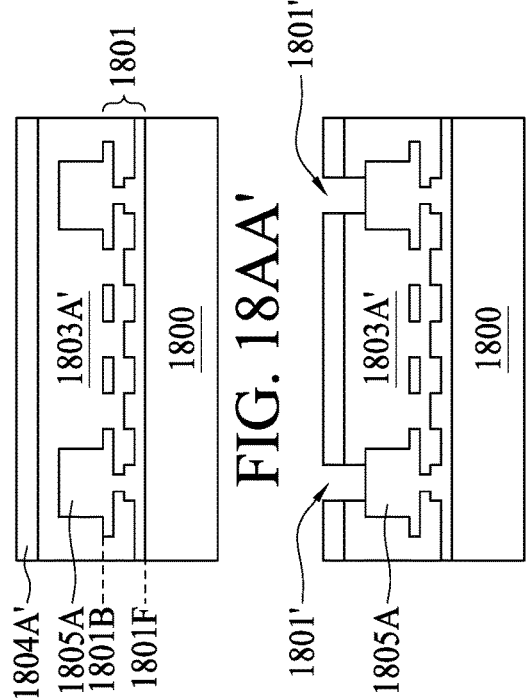
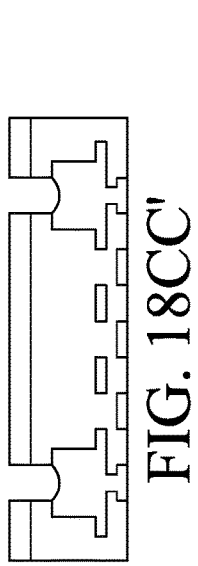

SEMICONDUCTOR PACKAGE STRUCTURE AND SEMICONDUCTOR SUBSTRATE

BACKGROUND

Recently, with the increasingly high demand of the market on electronic products and the advanced processing technique, more and more 3C products emphasize portable convenience and popularization of the demand of the market. Typical signal chip packaging technique cannot readily meet the increasingly demand of the market, and it has become a product trend to design and manufacture products with characteristics of being light, thin, short, and small, an increased packaging density, and a low cost. Therefore, under the precondition of being light, thin, short, and small, various integrated circuits (ICs) with different functions are integrated by using various stacking packaging manners, so as to reduce the package volume and package thickness, which is a main stream for the research on the market of various packaging products.

SUMMARY

Some embodiments of the present disclosure provide a semiconductor package structure, including a patterned conductive layer having a front surface, a back surface, and a side surface connecting the front surface and the back surface. The semiconductor package structure further includes a first semiconductor chip on the front surface and electrically connected to the patterned conductive layer, a first encapsulant covering at least the back surface of the patterned conductive layer, and a second encapsulant covering at least the front surface of the patterned conductive layer, the side surface being covered by one of the first encapsulant and the second encapsulant.

Some embodiments of the present disclosure provide a semiconductor substrate, including a patterned conductive layer, which has a front surface, a back surface, and a side surface connecting the front surface and the back surface. The semiconductor substrate further includes an encapsulant covering the back surface and the side surface of the patterned conductive layer.

Some embodiments of the present disclosure provide a method for manufacturing a semiconductor package structure. The method includes providing a carrier, forming a patterned conductive layer over the carrier. The patterned conductive layer having a front surface in contact with the carrier, a back surface, and a side surface connecting the front surface and the back surface. Forming a first encapsulant over the patterned conductive layer, covering the back surface and the side surface of the first encapsulant, and removing the carrier thereby exposing the front surface of the patterned conductive layer.

BRIEF DESCRIPTION OF THE DRAWINGS

Aspects of the present disclosure are best understood from the following detailed description when read with the accompanying figures. It should be noted that various features may not be drawn to scale. In fact, the dimensions of the various features may be arbitrarily increased or reduced for clarity of discussion.

FIG. 1A shows a cross section of a semiconductor package, in accordance with some comparative embodiments of the present disclosure.

FIG. 1B shows a cross section of a semiconductor package, in accordance with some comparative embodiments of the present disclosure.

FIG. 6A, FIG. 6B, FIG. 6C, FIG. 6D, FIG. 6E, and FIG. 6F show cross sections of the semiconductor package of FIG. 3B during intermediate manufacturing operations, in accordance with some embodiments of the present disclosure.

FIG. 7A, FIG. 7B, FIG. 7C, FIG. 7D, and FIG. 7E show cross sections of a semiconductor package during intermediate manufacturing operations, in accordance with some embodiments of the present disclosure.

FIG. 8A shows a cross section of the semiconductor substrate of FIG. 7A, in accordance with some embodiments of the present disclosure.

FIG. 8B shows a cross section of the semiconductor substrate of FIG. 7B ready for singulation, in accordance with some embodiments of the present disclosure.

FIG. 9A shows a cross section of a chip scale package (CSP) having a 2-layer embedded trace substrate (ETS), in accordance with some embodiments of the present disclosure.

FIG. 9B shows a cross section of a land grid array (LGA) package having a 2-layer embedded trace substrate (ETS), in accordance with some embodiments of the present disclosure.

FIG. 10A, FIG. 10B, FIG. 10C, FIG. 10D, FIG. 10E, FIG. 10F, and FIG. 10G show cross sections of the semiconductor package of FIG. 9A during intermediate manufacturing operations, in accordance with some embodiments of the present disclosure.

FIG. 10CA, FIG. 10CB, FIG. 10CC, and FIG. 10CD are cross sections of a semiconductor package during intermediate manufacturing operations, in accordance with some embodiments of the present disclosure.

FIG. 11A shows a cross section of the semiconductor substrate of FIG. 10B, in accordance with some embodiments of the present disclosure.

FIG. 11B shows a cross section of the semiconductor substrate of FIG. 10C ready for singulation, in accordance with some embodiments of the present disclosure.

9A during intermediate manufacturing operations, in accordance with some embodiments of the present disclosure.

Figure 12A:
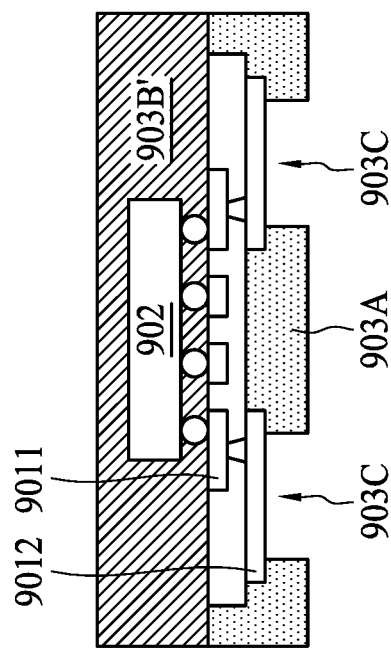
FIG. 12A, FIG. 12B, FIG. 12C, FIG. 12D, and FIG. 12E show cross sections of the semiconductor package of FIG.

FIG. 13A shows a cross section of the semiconductor substrate of FIG. 12A, in accordance with some embodiments of the present disclosure.

Figure 12B:
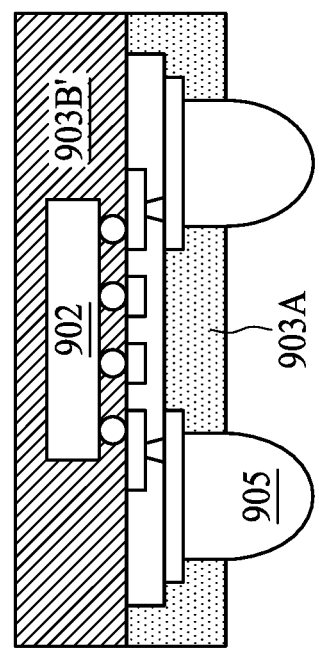

FIG. 13B shows a cross section of the semiconductor substrate of FIG. 12B ready for singulation, in accordance with some embodiments of the present disclosure.

FIG. 14A, FIG. 14B, FIG. 14C, FIG. 14D, FIG. 14E, and FIG. 14F show cross sections of the semiconductor package of FIG. 9B during intermediate manufacturing operations, in accordance with some embodiments of the present disclosure.

FIG. 15A shows a cross section of the semiconductor substrate of FIG. 14B, in accordance with some embodiments of the present disclosure.

FIG. 15B shows a cross section of the semiconductor substrate of FIG. 14C ready for singulation, in accordance with some embodiments of the present disclosure.

FIG. 16A, FIG. 16B, and FIG. 16C show cross sections of chip scale packages (CSP) having a 2-layer embedded trace substrate (ETS) integrated with passive devices, in accordance with some embodiments of the present disclosure.

Figure 17A:
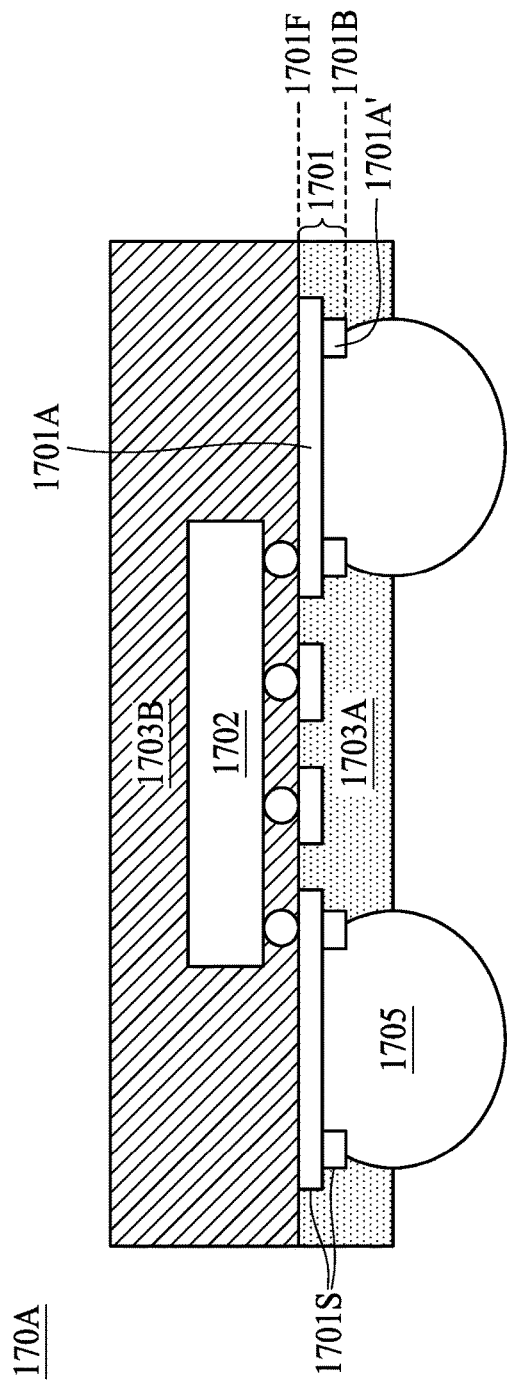

FIG. 17A shows a cross section of a chip scale package (CSP) having a 1-layer molded interconnect substrate (MIS), in accordance with some embodiments of the present disclosure.

Figure 17B:
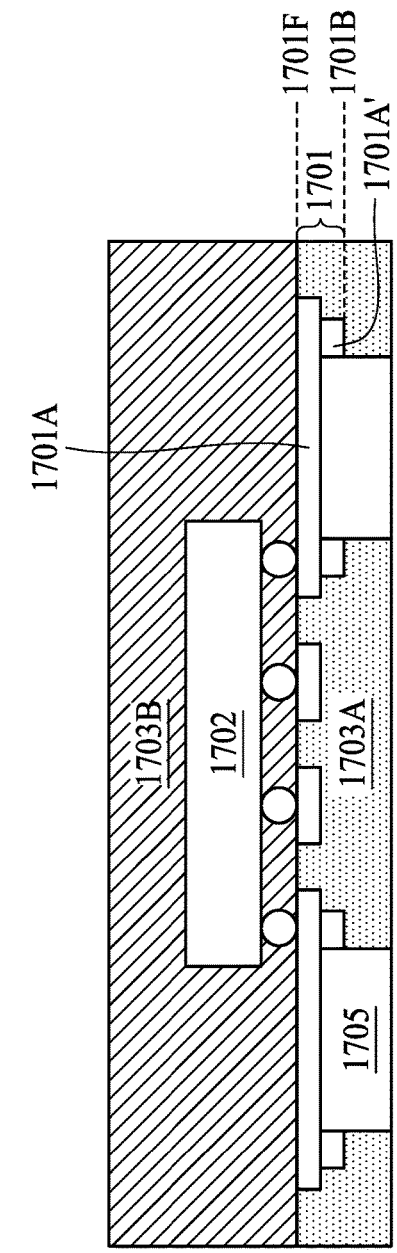

FIG. 17B shows a cross section of a land grid array (LGA) having a 1-layer molded interconnect substrate (MIS), in accordance with some embodiments of the present disclosure.

FIG. 18A, FIG. 18B, FIG. 18C, FIG. 18D, FIG. 18E, FIG. 18F, and FIG. 18G show cross sections of the semiconductor package of FIG. 17A during intermediate manufacturing operations, in accordance with some embodiments of the present disclosure.

FIG. 18AA, FIG. 18BB, FIG. 18CC, FIG. 18DD, FIG. 18EE, FIG. 18FF, and FIG. 18GG show cross sections of a semiconductor package having a 2-layer MIS during intermediate manufacturing operations, in accordance with some embodiments of the present disclosure.

FIG. 18AA', FIG. 18BB', FIG. 18CC', and FIG. 18DD' show cross sections of a semiconductor package having a 2-layer resin-coated-copper (RCC) ETS during intermediate manufacturing operations, in accordance with some embodiments of the present disclosure.

FIG. 18AA", FIG. 18BB", FIG. 18CC", and FIG. 18DD" show cross sections of a semiconductor package having a 2-layer printable dielectric ETS during intermediate manufacturing operations, in accordance with some embodiments of the present disclosure.

Figure 19A:
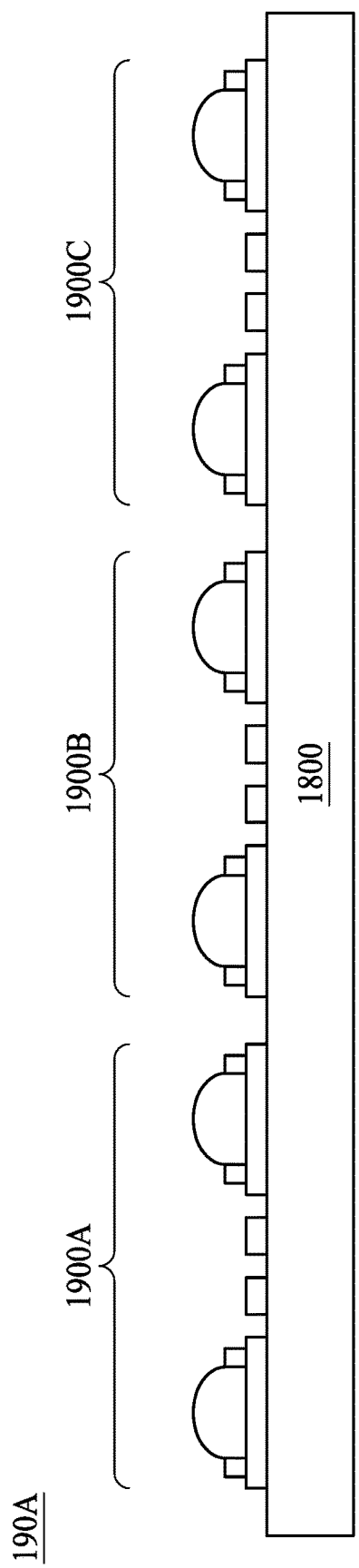

FIG. 19A shows a cross section of the semiconductor substrate of FIG. 18B, in accordance with some embodiments of the present disclosure.

Figure 19B:
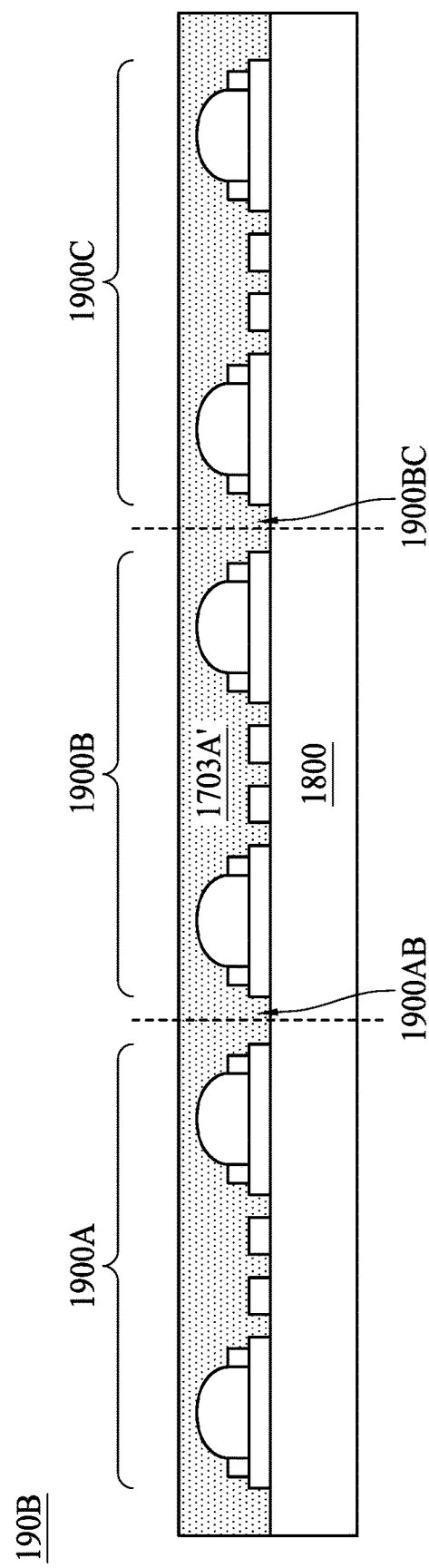

FIG. 19B shows a cross section of the semiconductor substrate of FIG. 18C ready for singulation, in accordance with some embodiments of the present disclosure.

Figure 20A:
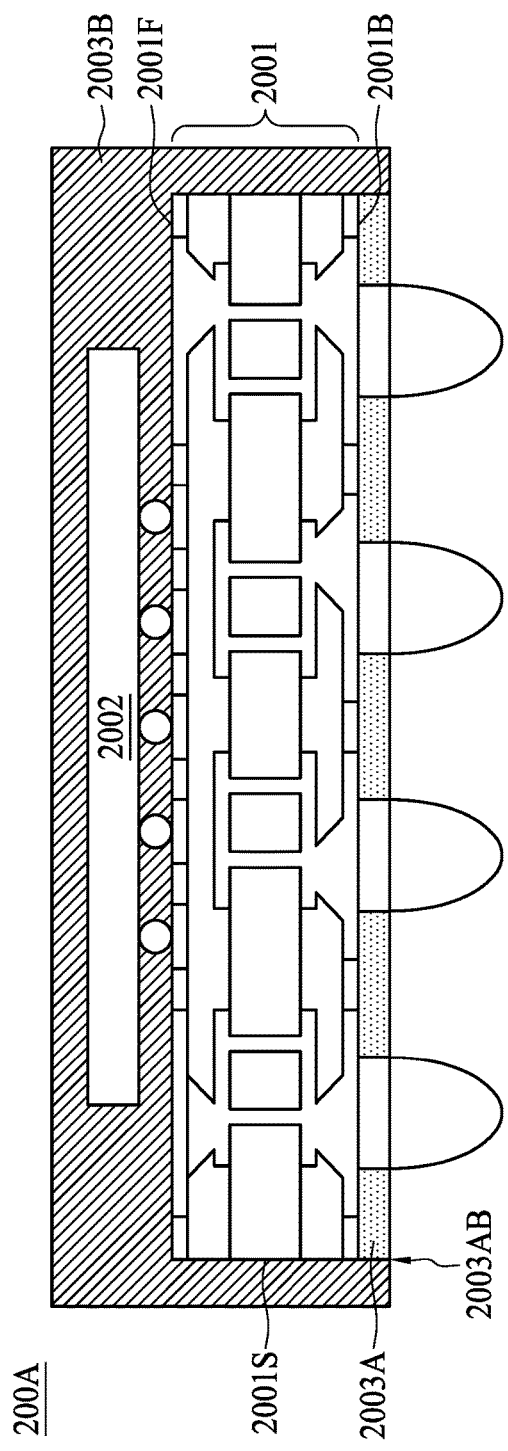

FIG. 20A shows a cross section of a core semiconductor package having a vertical molding boundary, in accordance with some embodiments of the present disclosure.

Figure 20B:
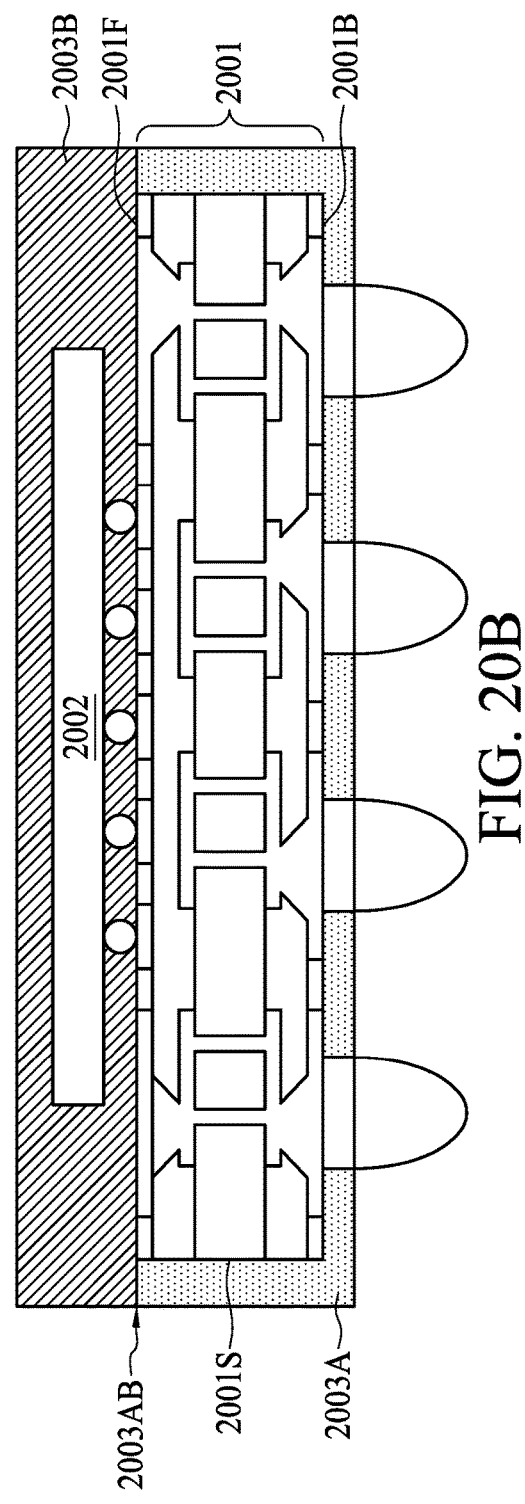

FIG. 20B shows a cross section of a core semiconductor package having a horizontal molding boundary, in accordance with some embodiments of the present disclosure.

FIG. 21A, FIG. 21B, FIG. 21C, and FIG. 21D show cross sections of the core semiconductor package of FIG. 20A during intermediate manufacturing operations, in accordance with some embodiments of the present disclosure.

FIG. 22A, FIG. 22B, FIG. 22C, FIG. 22D, and FIG. 22E show cross sections of the core semiconductor package of FIG. 20B during intermediate manufacturing operations, in accordance with some embodiments of the present disclosure.

FIG. 23A, FIG. 23B, FIG. 23C, FIG. 23D, and FIG. 23E show cross sections of the core semiconductor package of FIG. 20B during intermediate manufacturing operations, in accordance with some embodiments of the present disclosure.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Electronic packages for vehicle application trends toward compact/thin package profile and high reliability. In the aforesaid electronic packages, carriers include lead frame and organic substrate. Compared to organic substrate-based counterpart, lead frame-based product possesses higher reliability but is thicker and less versatile in conductive line routing. Organic substrate-based, on the other hand, can possess one or more conductive line layers so as to demonstrate its versatility in conductive line routing. However, when organic substrate-based package thickness is smaller than 100 micrometer, or even 50 micrometer, carrier-attaching and de-carrier operations are included during packaging process to compensate the weak mechanical strength of the substrate.

The carrier-attaching and de-carrier operations increase the cost of packaging process. In addition, during molding operation, attached substrate is prone to peel off from the carrier and causing popcorn effect during high temperature treatments. Lastly, in the final package product, the organic substrate (dielectric material) is directly exposed to ambient environment and can generate reliability problem due to its high hygroscopicity (moisture-absorption).

A thin package structure (e.g., substrate thinner than 100 micrometer) with decent reliability during packaging operations and having a protection layer mitigating the consequence of moisture-absorption at the substrate is of demand.

Some embodiments provide a package structure with a first molding encapsulating conductive line layers (e.g., dielectric, conductive lines, solder bump) and a second molding encapsulating a die bonded to the conductive line layers. The first molding is then grinded to expose the solder bump. Some embodiments also provide a package structure with a first molding encapsulating conductive line layers (e.g., dielectric, conductive lines) and a second molding encapsulating a die bonded to the conductive line layers. The first molding is then laser-drilled to expose a portion of the conductive line layers and plant solder bumps thereon. The first molding provides mechanical support for the conductive line layers during packaging operations, covering a bottom surface and a side surface of the conductive line layers so as to mitigate the moisture-absorption problem.

Referring to FIG. 1A, FIG. 1A shows a cross section of a semiconductor package with a 1-layer embedded trace substrate (ETS) 100 and a semiconductor die 110 flip-chip bonded to a top surface of the ETS 100, in accordance with some comparative embodiments of the present disclosure. Molding compound 120 encapsulates a top and a side of the semiconductor die 110, as well as the top surface of the ETS 100. In current comparative embodiment, molding compound 120 is free from covering a side 100S of the ETS 100. In some embodiments, the side 100S of the ETS 100 is exposed to ambient and the exposed side 100S may be composed of organic dielectric materials such as BT (bis-maleimide-triazine) resin or epoxy resin.

Referring to FIG. 1B, FIG. 1B shows a cross section of a semiconductor package with a 2-layer embedded trace substrate (ETS) 101 and a semiconductor die 111 flip-chip bonded to a top surface of the ETS 101, in accordance with some comparative embodiments of the present disclosure. Molding compound 120 encapsulates a top and a side of the semiconductor die 111, as well as the top surface of the ETS 101. In current comparative embodiment, molding compound 120 is free from covering a side 101S of the multi-layer ETS 101. In some embodiments, the side 101S of the multi-layer ETS 101 is exposed to ambient and the exposed side 101S may be composed of organic dielectric materials such as BT (bismaleimide-triazine) resin or epoxy resin.

As previously discussed, organic material directly exposed to ambient environment and can generate reliability problem due to its high hygroscopicity (moisture-absorption). Therefore, reliability of the semiconductor packages shown in FIG. 1A and FIG. 1B may be greatly affected by the hygroscopicity of the organic substrate material used.

Figure 2A:
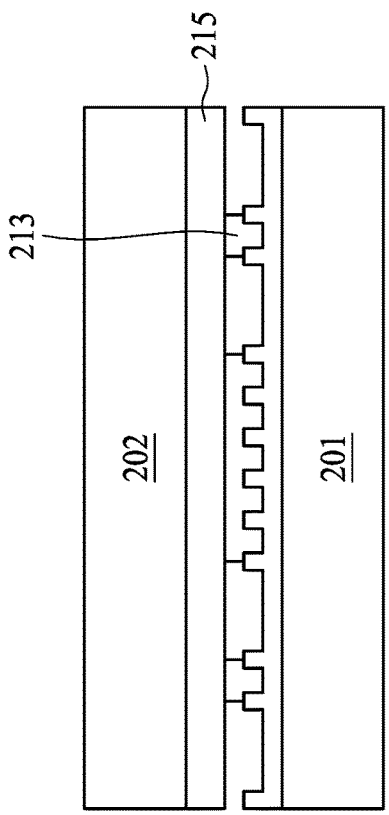
FIG. 2A, FIG. 2B, FIG. 2C, FIG. 2D, and FIG. 2E show cross sections of a semiconductor substrate during intermediate manufacturing operations, in accordance with some comparative embodiments of the present disclosure.
Figure 2B:
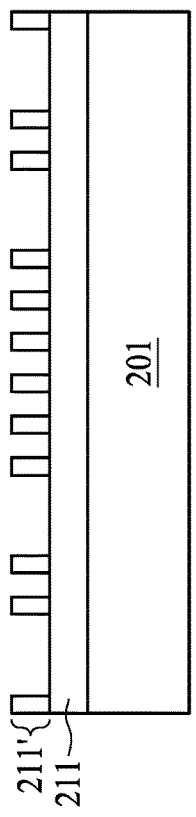
Figure 2C:
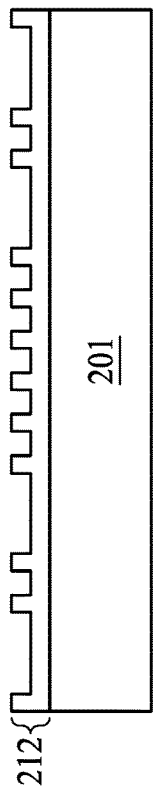
Figure 2D:
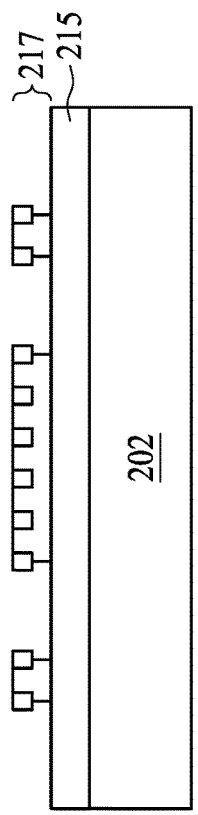
Figure 2E:
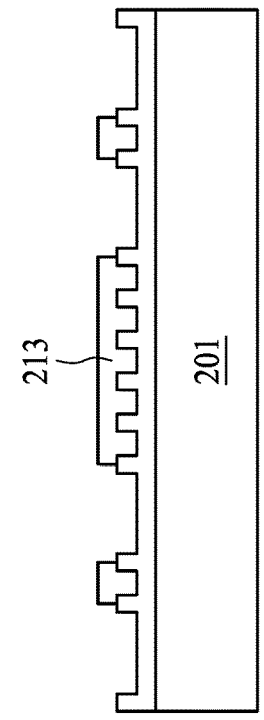

FIG. 2A to FIG. 2E show cross sections of a thin semiconductor substrate during intermediate manufacturing operations, in accordance with some comparative embodiments of the present disclosure. In some comparative embodiments, the semiconductor substrate fabricated has a thickness smaller than 100 μm. In FIG. 2A, a first carrier 201 coated with a copper layer 211 is provided. A patterning layer 211', for example, a photoresist layer, is disposed over the copper layer 211, so as to form a patterned copper layer 212 in FIG. 2B. Solder mask 213 is then formed and patterned over the patterned copper layer 212 in FIG. 2C. A second carrier 202, having copper layer 215 coated at least on one surface, is laminated to the first carrier 201 via the patterned solder mask 213 by a pressing operation, as illustrated in FIG. 2D. A de-carrier operation is then performed in FIG. 2E to detach the first carrier 201 from the second carrier 202 and the laminated layers thereon, followed by a copper flash etching to expose a surface of the solder mask 213 away from the copper layer 215. Up to FIG. 2E, a portion of a first conductive traces 217 in the thin substrate is formed with the support of the second carrier 202, and other conductive traces can be further stacked over the first conductive traces 217 by similar carrier-attaching and de-carrier operation before the mechanical strength of the thin substrate is sufficient for various fabrication handlings.

As previously discussed, carrier-attaching and de-carrier operations increase the cost of packaging process and the attached substrate is prone to peel off from the carrier and causing popcorn effect during high temperature treatments.

Figure 3A:
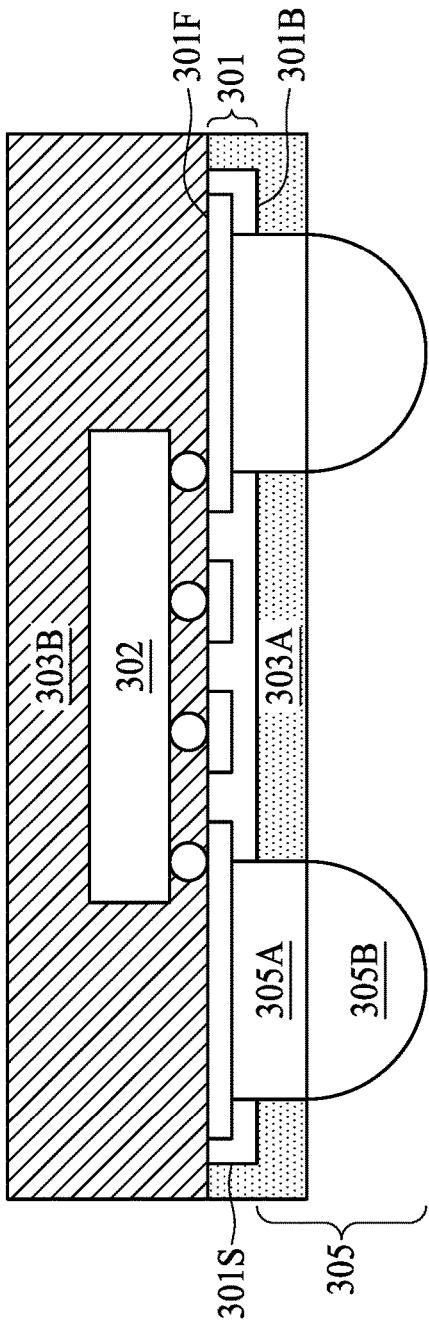
FIG. 3A shows a cross section of a chip scale package (CSP) having a 1-layer embedded trace substrate (ETS), in accordance with some embodiments of the present disclosure.

Referring to FIG. 3A, FIG. 3A shows a cross section of a chip scale package (CSP) 30A having a 1-layer embedded trace substrate (ETS), in accordance with some embodiments of the present disclosure. The CSP 30A includes a patterned conductive layer 301, for example, a 1-layer conductive trace embedded in an organic dielectric layer. The patterned conductive layer 301 has a front surface 301F and a back surface 301B opposite to the front surface 301F. The front surface 301F is closer to a semiconductor chip 302 than the back surface 301B. In some embodiments, the front surface 301F exposes a portion of the embedded trace in order to form electrical connection between the patterned conductive layer 301 and the semiconductor chip 302.

The CSP 30A further includes a first encapsulant 303A positioned at the back surface 301B of the patterned conductive layer 301. As shown in FIG. 3A, the first encapsulant 303A covers the back surface 301B and a side surface 301S of the patterned conductive layer 301. Since the side surface 301S of the patterned conductive layer 301 may be composed of organic dielectric material with high hygroscopicity, coverage of the first encapsulant 303A at the side surface 301S may lower the water adsorption rate at the organic dielectric material and prevent the patterned conductive layer 301 from degradation. The CSP 30A further includes a second encapsulant 303B positioned at the front surface 301F of the patterned conductive layer 301. The second encapsulant 303B covering the top, the side, and the bottom of the semiconductor chip 302, as well as the front surface 301F of the patterned conductive layer 301. At the edge of the CSP 30A, the first encapsulant 303A and the second encapsulant 303B are in direct contact and a boundary between the two encapsulants can be observed. For example, a horizontal boundary substantially leveling with the front surface 301F of the patterned conductive layer 301 can be observed in the CSP 30A.

The CSP 30A of FIG. 3A further includes a conductive element 305 positioned at the back surface 301B of the patterned conductive layer 301 and electrically connected to the embedded traces in the patterned conductive layer 301. In some embodiments, the conductive element 305 is partially surrounded by the first encapsulant 303A. For example as depicted in FIG. 3A, the conductive element 305 includes a first portion 305A laterally encapsulated by the first encapsulant 303A and a second portion 305B protruding from a surface of the first encapsulant 303A. The first portion 305A and the second portion 305B are physically bonded and can be composed of the same of different materials. For example, the first portion 305A can be composed of solder or copper in a form of a solder pillar or a copper pillar. The second portion 305B can be composed of solder bump or solder ball. In some embodiments, the first portion 305A has a first surface in direct contact with the embedded traces in the patterned conductive layer 301 and a second surface opposite to the first surface. The second surface is coplanar to a bottom surface of the first encapsulant 303A. The bottom surface of the first encapsulant 303A is more distant from the semiconductor chip 302 than a top surface of the first encapsulant 303A.

The first encapsulant 303A of the CSP 30A can be composed of epoxy and filler for heat conduction enhancement. The filler can be in spherical shape or pillar shape. In some embodiments, an incomplete filler, for example, fillers in broken sphere or broken pillar shape, can be observed at the bottom surface of the first encapsulant 303A, as a result of planarization operation at such bottom surface. In order to prevent water absorption at the organic dielectric material of the patterned conductive layer 301, the first encapsulant 303A may have a water absorption rate, for example, less than or equal to 0.5%, lower than the organic material being encapsulated. The first encapsulant 303A may be selected from dielectric materials having a Young's modulus greater than or equal to 15 GPa to provide sufficient mechanical support to the patterned conductive layer 301 during its fabrication and handling.

The second encapsulant 303B may be composed of the same of different materials as the first encapsulant 303A. For example, the second encapsulant 303B may or may not be composed of epoxy and filler, incomplete fillers. The second encapsulant 303B may or may not have a water absorption rate less than or equal to 0.5% or a Young's modulus greater than or equal to 15 GPa.

Figure 3B:
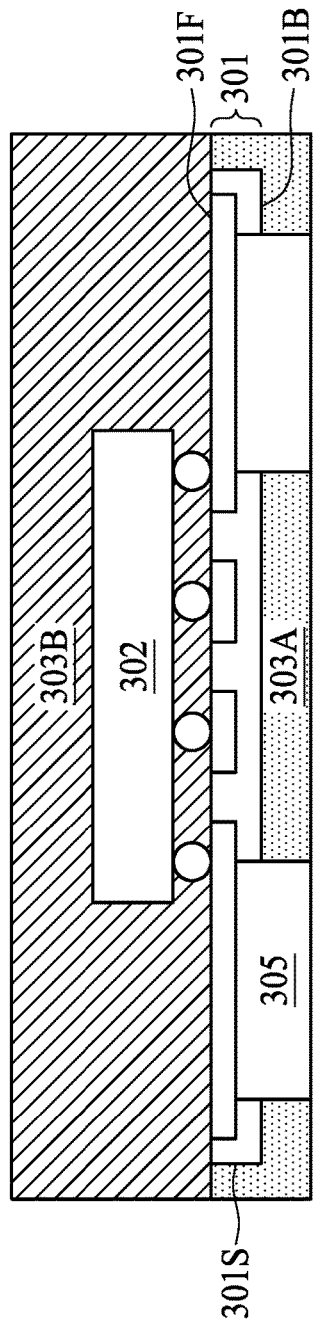
FIG. 3B shows a cross section of a land grid array (LGA) package having a 1-layer embedded trace substrate (ETS), in accordance with some embodiments of the present disclosure.

FIG. 3B shows a land grid array (LGA) package 30B having a 1-layer embedded trace substrate (ETS), in accordance with some embodiments of the present disclosure. Identical numerical label in FIG. 3B and FIG. 3A indicates similar element or its equivalent and is not repeated here for brevity. The conductive element 305 in the LGA package 30B can be composed of a solder pillar laterally surrounded by the first encapsulant 303A. The bottom of the solder pillar may be coplanar with the bottom surface of the first encapsulant 303A.

Figure 4A:
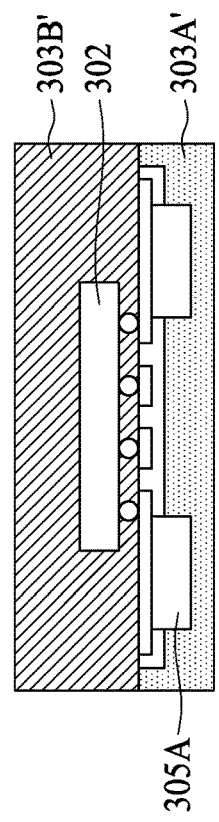
FIG. 4A, FIG. 4B, FIG. 4C, FIG. 4D, FIG. 4E, FIG. 4F, and FIG. 4G show cross sections of the semiconductor package of FIG. 3A during intermediate manufacturing operations, in accordance with some embodiments of the present disclosure.
Figure 4B:
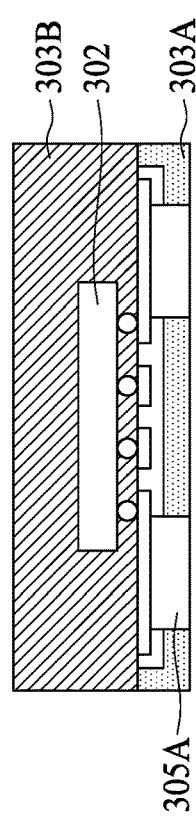
Figure 4C:
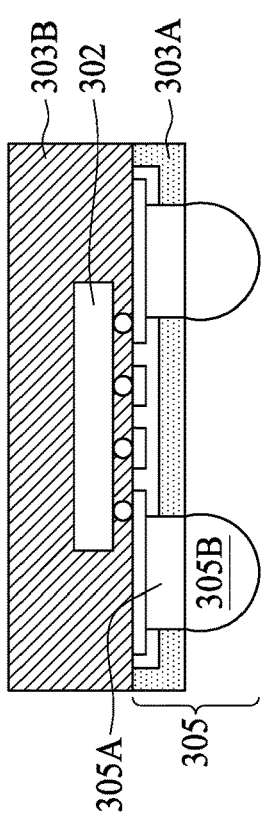

FIG. 4A to FIG. 4G show cross sections of the CSP 30A of FIG. 3A during intermediate manufacturing operations, in accordance with some embodiments of the present disclosure. In FIG. 4A, a patterned conductive layer 301, for example, a 1-layer embedded trace structure, is formed on a carrier 400. The patterned conductive layer 301 has a front surface 301F in contact with the carrier 400 and a back surface 301B opposite to the front surface 301F. A side surface 301S of the patterned conductive layer 301 connects the front surface 301F and the back surface 301B. In some embodiments, the organic dielectric material is patterned to expose a portion of the conductive traces. In FIG. 4B, a first portion 305A of the conductive element, such as a copper pillar or a solder pillar, is connected to the conductive traces through the opening previously exposed from the organic dielectric material, for example, by a lithography operation. The first portion 305A of the conductive element protrudes from the back surface 301B of the patterned conductive layer 301. The first encapsulant layer 303A' is formed to cover the first portion 305A of the conductive element, the back surface 301B, and the side surface 301S of the patterned conductive layer 301, as shown in FIG. 4C. A plurality of patterned conductive layer units can be formed on the carrier 400 up to the operation in FIG. 4C prior to a singulation operation, as will be discussed in FIG. 5A and FIG. 5B.

Figure 4D:
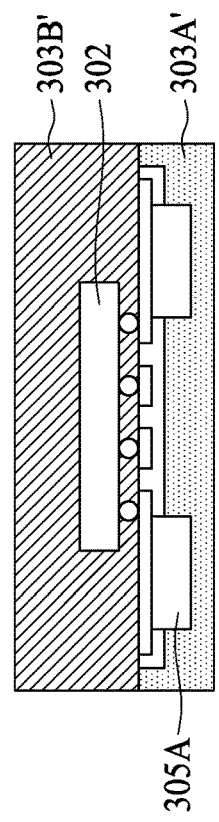
Figure 4E:
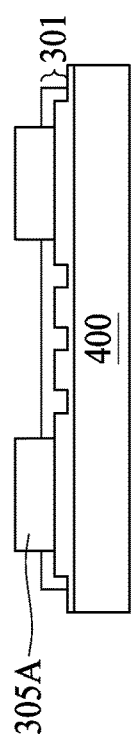
Figure 4F:
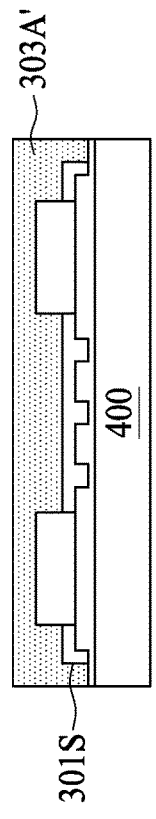
Figure 4G:
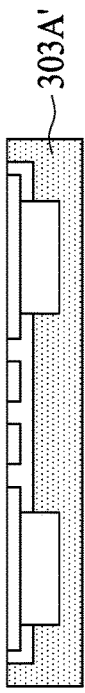

FIG. 4D shows a de-carrier operation where the carrier 400 is detached from the patterned conductive layer 301 and the first encapsulant layer 303A' and exposing the front surface 301F of the patterned conductive layer 301. A semiconductor chip 302 is flip-chip bonded to the conductive traces exposed at the front surface 301F of the patterned conductive layer 301, and subsequently, encapsulated by the second encapsulant layer 303B'. As shown in FIG. 4E, the second encapsulant layer 303B' covers the semiconductor chip 302, the front surface 301F of the patterned conductive layer 301, and the first encapsulant layer 303A'. FIG. 4F is a planarization or thinning operation where the first encapsulant layer 303A' is planarized or thinned down to expose the first portion 305A of the conductive element, or forming a coplanar surface composed of the first encapsulant 303A and the first portion 305A of the conductive element. The second encapsulant layer 3033 may optionally be thinned at current operation or previous operation to obtain the second encapsulant 303B with desired thickness. In FIG. 4G, a second portion 305B of the conductive element, such as a solder ball or solder bump, is connected to the first portion 305A, electrically connected to the patterned conductive layer 301 and the semiconductor chip 302.

Figure 5A:
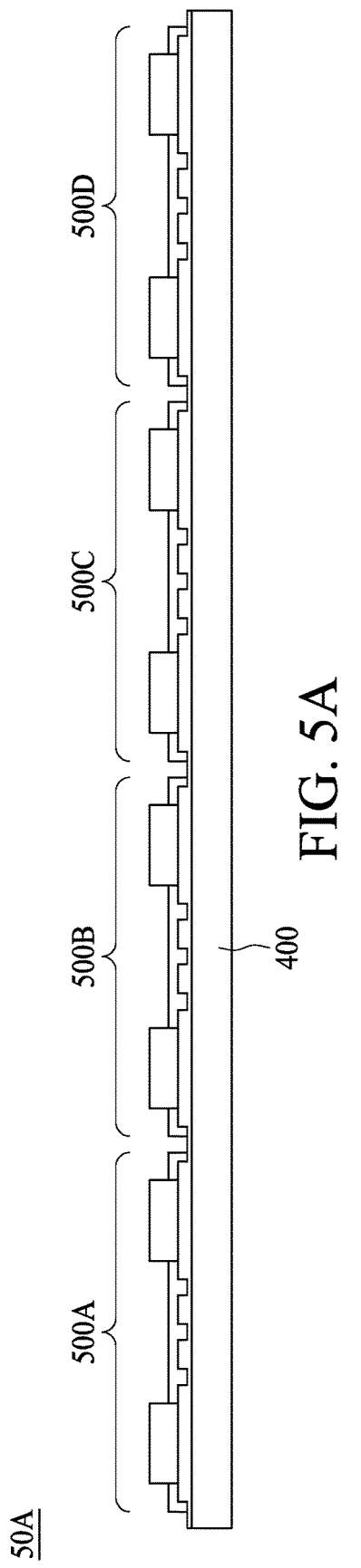
FIG. 5A shows a cross section of the semiconductor substrate of FIG. 4B, in accordance with some embodiments of the present disclosure.
Figure 5B:
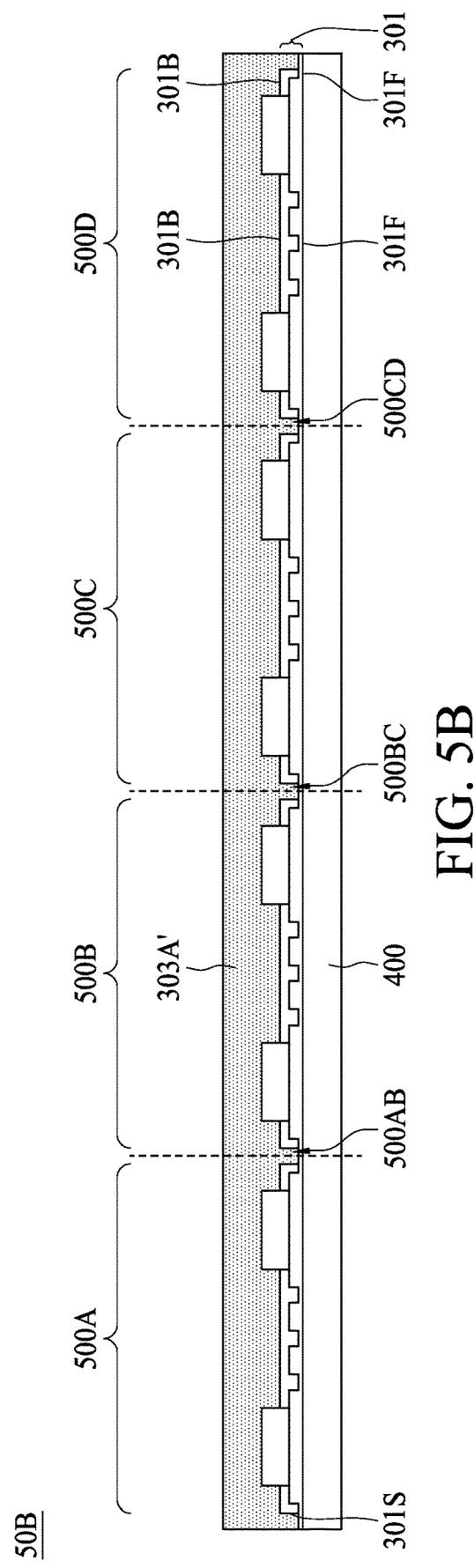
FIG. 5B shows a cross section of the semiconductor substrate of FIG. 4C ready for singulation, in accordance with some embodiments of the present disclosure.

FIG. 5A shows a cross section of the semiconductor substrate 50A of FIG. 4B, and FIG. 5B shows a cross section of the semiconductor substrate 50B of FIG. 4C ready for singulation, in accordance with some embodiments of the present disclosure. As previously described, the plurality of patterned conductive layer units 500A, 500B, 500C, and 500D, are formed on the carrier 400 prior to the singulation operation, as shown in FIG. 5A. Subsequently, the first encapsulant layer 303A' is formed over the plurality of patterned conductive layer units 500A, 500B, 500C, and 500D, filling gaps 500AB, 500BC, and 500CD, between adjacent patterned conductive layer units. The semiconductor substrate 50B is then die sawed into a plurality of singulated substrate chips for subsequent packaging operations. Each of the singulated substrate chips having a side surface 301S covered by the first encapsulant layer 303A', as illustrated in FIG. 4C.

FIG. 6A to FIG. 6F show cross sections of the LGA package 30B of FIG. 3B during intermediate manufacturing operations, in accordance with some embodiments of the present disclosure. In FIG. 6A, a patterned conductive layer 301, for example, a 1-layer embedded trace structure, is formed on a carrier 400. The patterned conductive layer 301 has a front surface 301F in contact with the carrier 600 and a back surface 301B opposite to the front surface 301F. A side surface 301S of the patterned conductive layer 301 connects the front surface 301F and the back surface 301B. In some embodiments, the organic dielectric material is patterned to expose a portion of the conductive traces. In FIG. 6B, a conductive element 305, such as a solder bump or a solder ball, is connected to the conductive traces through the opening previously exposed from the organic dielectric material. The first portion 305A of the conductive element protrudes from the back surface 301B of the patterned conductive layer 301. The first encapsulant layer 303A' is formed to cover the conductive element 305, the back surface 301B, and the side surface 301S of the patterned conductive layer 301, as shown in FIG. 6C. A plurality of patterned conductive layer units can be formed on the carrier 600 up to the operation in FIG. 6C prior to a singulation operation.

FIG. 6D shows a de-carrier operation where the carrier 600 is detached from the patterned conductive layer 301 and the first encapsulant layer 303A' and exposing the front surface 301F of the patterned conductive layer 301. A semiconductor chip 302 is flip-chip bonded to the conductive traces exposed at the front surface 301F of the patterned conductive layer 301, and subsequently, encapsulated by the second encapsulant layer 303B'. As shown in FIG. 6E, the second encapsulant layer 303B' covers the semiconductor chip 302, the front surface 301F of the patterned conductive layer 301, and the first encapsulant layer 303A'. FIG. 6F is a planarization or thinning operation where the first encapsulant layer 303A' is planarized or thinned down to expose the conductive element 305 forming a coplanar surface composed of the first encapsulant 303A and the conductive element 305. The second encapsulant layer 303B' may optionally be thinned at current operation or previous operation to obtain the second encapsulant 303B with desired thickness.

FIG. 7A to FIG. 7E show cross sections of a semiconductor package during intermediate manufacturing operations, in accordance with some embodiments of the present disclosure. In FIG. 7A, a patterned conductive layer 301, for example, a 1-layer embedded trace structure, is formed on a carrier 700. The patterned conductive layer 301 has a front surface 301F in contact with the carrier 700 and a back surface 301B opposite to the front surface 301F. A side surface 301S of the patterned conductive layer 301 connects the front surface 301F and the back surface 301B. In some embodiments, the organic dielectric material is patterned to expose a portion of the conductive traces. In FIG. 7B, the first encapsulant layer 303A' is formed to cover the patterned conductive layer 301 and the carrier 700. A plurality of patterned conductive layer units can be formed on the carrier 700 up to the operation in FIG. 7B prior to a singulation operation, as will be described in FIG. 8A and FIG. 8B.

FIG. 7C shows a de-carrier operation where the carrier 700 is detached from the patterned conductive layer 301 and the first encapsulant layer 303A' and exposing the front surface 301F of the patterned conductive layer 301. A semiconductor chip 302 is flip-chip bonded to the conductive traces exposed at the front surface 301F of the patterned conductive layer 301, and subsequently, encapsulated by the second encapsulant layer 3033. The second encapsulant layer 3033 covers the semiconductor chip 302, the front surface 301F of the patterned conductive layer 301, and the first encapsulant layer 303A'. Optionally, the first encapsulant layer 303A' can be planarized or thinned down to be the first encapsulant 303A with desired thickness. In FIG. 7D, a portion of the first encapsulant 303A is removed to expose conductive traces in the patterned conductive layer 301 through an opening 303C. In some embodiments, the opening 303C is formed by machining, lasers or photo-etching. The types of the lasers include carbon dioxide laser, YAG (yttrium aluminum garnet) laser, excimer laser, etc., wherein the carbon dioxide laser is preferred. In some embodiments, dimension of the opening is determined according to the size of the conductive element 305, for example, a solder ball or a solder paste. As shown in FIG. 7E, the conductive element 305 may be placed or filled into the openings 303C, followed by a proper reflow operation. The conductive element 305 can be protruded from the bottom surface of the first encapsulant 303A.

FIG. 8A shows a cross section of the semiconductor substrate 80A of FIG. 7A, and FIG. 8B shows a cross section of the semiconductor substrate 80B of FIG. 7B ready for singulation, in accordance with some embodiments of the present disclosure. As previously described, the plurality of patterned conductive layer units 800A, 800B, 800C, and 800D, are formed on the carrier 700 prior to the singulation operation, as shown in FIG. 8A. Subsequently, the first encapsulant layer 303A' is formed over the plurality of patterned conductive layer units 800A, 800B, 800C, and 800D, filling gaps 500AB, 500BC, and 500CD, between adjacent patterned conductive layer units. The semiconductor substrate 80B is then die sawed into a plurality of singulated substrate chips for subsequent packaging operations. Each of the singulated substrate chips having a side surface 301S covered by the first encapsulant layer 303A', as illustrated in FIG. 7B.

Referring to FIG. 9A, FIG. 9A shows a cross section of a chip scale package (CSP) 90A having a 2-layer embedded trace substrate (ETS), in accordance with some embodiments of the present disclosure. The CSP 90A includes a patterned conductive layer 901, for example, a 2-layer conductive trace at least partially embedded in an organic dielectric layer 9010. For example, the 2-layer conductive trace includes a first conductive layer 9011 close to the front surface 901F, a second conductive layer 9012 close to the back surface 901B, and a conductive via 9013 connecting the first conductive layer 9011 and the second conductive layer 9012. The second conductive layer 9012 can be exposed from the organic dielectric layer 9010. The patterned conductive layer 901 has a front surface 901F and a back surface 901B opposite to the front surface 901F. The front surface 901F is closer to a semiconductor chip 902 than the back surface 901B. In some embodiments, the front surface 901F exposes a portion of the embedded trace in order to form electrical connection between the patterned conductive layer 901 and the semiconductor chip 902.

The CSP 90A further includes a first encapsulant 903A positioned at the back surface 901B of the patterned conductive layer 901. As shown in FIG. 9A, the first encapsulant 903A covers the back surface 901B and a side surface 901S of the patterned conductive layer 901. Since the side surface 901S of the patterned conductive layer 901 may be composed of organic dielectric material with high hygroscopicity, coverage of the first encapsulant 903A at the side surface 901S may lower the water adsorption rate at the organic dielectric material and prevent the patterned conductive layer 901 from degradation. The CSP 90A further includes a second encapsulant 903B positioned at the front surface 901F of the patterned conductive layer 901. The second encapsulant 903B covering the top, the side, and the bottom of the semiconductor chip 902, as well as the front surface 901F of the patterned conductive layer 901. At the edge of the CSP 90A, the first encapsulant 903A and the second encapsulant 903B are in direct contact and a boundary between the two encapsulants can be observed. For example, a horizontal boundary substantially leveling with the front surface 901F of the patterned conductive layer 901 can be observed in the CSP 90A.

The CSP 90A of FIG. 9A further includes a conductive element 905 positioned at the back surface 901B of the patterned conductive layer 901 and electrically connected to the embedded traces in the patterned conductive layer 901. In some embodiments, the conductive element 905 is partially surrounded by the first encapsulant 903A. For example as depicted in FIG. 9A, the conductive element 905 includes a first portion 905A laterally encapsulated by the first encapsulant 903A and a second portion 905B protruding from a surface of the first encapsulant 903A. The first portion 905A and the second portion 905B are physically bonded and can be composed of the same of different materials. For example, the first portion 905A can be composed of solder or copper in a form of a solder pillar or a copper pillar. The second portion 905B can be composed of solder bump or solder ball. In some embodiments, the first portion 905A has a first surface in direct contact with the embedded traces in the patterned conductive layer 901 and a second surface opposite to the first surface. The second surface is coplanar to a bottom surface of the first encapsulant 903A. The bottom surface of the first encapsulant 903A is more distant from the semiconductor chip 902 than a top surface of the first encapsulant 903A.

The first encapsulant 903A of the CSP 90A can be composed of epoxy and filler for heat conduction enhancement. The filler can be in spherical shape or pillar shape. In some embodiments, an incomplete filler, for example, fillers in broken sphere or broken pillar shape, can be observed at the bottom surface of the first encapsulant 903A, as a result of planarization operation at such bottom surface. In order to prevent water absorption at the organic dielectric material of the patterned conductive layer 901, the first encapsulant 903A may have a water absorption rate, for example, less than or equal to 0.5%, lower than the organic material being encapsulated. The first encapsulant 303A may be selected from dielectric materials having a Young's modulus greater than or equal to 15 GPa to provide sufficient mechanical support to the patterned conductive layer 901 during its fabrication and handling.

The second encapsulant 903B may be composed of the same of different materials as the first encapsulant 903A. For example, the second encapsulant 903B may or may not be composed of epoxy and filler, incomplete fillers. The second encapsulant 903B may or may not have a water absorption rate less than or equal to 0.5% or a Young's modulus greater than or equal to 15 GPa.

FIG. 9B shows a land grid array (LGA) package 90B having a 1-layer embedded trace substrate (ETS), in accordance with some embodiments of the present disclosure. Identical numerical label in FIG. 9B and FIG. 3A indicates similar element or its equivalent and is not repeated here for brevity. The conductive element 905 in the LGA package 90B can be composed of a solder pillar laterally surrounded by the first encapsulant 903A. The bottom of the solder pillar may be coplanar with the bottom surface of the first encapsulant 903A.

FIG. 10A to FIG. 10G show cross sections of the CSP 90A of FIG. 9A during intermediate manufacturing operations, in accordance with some embodiments of the present disclosure. In FIG. 10A, a patterned conductive layer 901, for example, a 2-layer embedded trace structure, is formed on a carrier 1000. The patterned conductive layer 901 has a front surface 901F in contact with the carrier 1000 and a back surface 901B opposite to the front surface 901F. A side surface 901S of the patterned conductive layer 901 connects the front surface 901F and the back surface 901B. A continuous conductive layer 9011' covers the top surface of the carrier 1000 and connects individual pattern of the first conductive layer 9011. In FIG. 10B, a first portion 905A of the conductive element, such as a copper pillar or a solder pillar, is connected to the conductive traces through the opening previously exposed from the organic dielectric material, for example, by a lithography operation. The first portion 905A of the conductive element protrudes from the back surface 901B of the patterned conductive layer 901. The first encapsulant layer 903A' is formed to cover the first portion 905A of the conductive element, the back surface 901B, and the side surface 901S of the patterned conductive layer 901, as shown in FIG. 10C. A plurality of patterned conductive layer units can be formed on the carrier 1000 up to the operation in FIG. 10C prior to a singulation operation, as will be discussed in FIG. 11A and FIG. 11B.

FIG. 10D shows a de-carrier operation where the carrier 1000 is detached from the patterned conductive layer 901 and the first encapsulant layer 903A' and exposing the front surface 901F of the patterned conductive layer 901. The continuous conductive layer 9011' is removed in current operation by a flash etching operation. A semiconductor chip 902 is flip-chip bonded to the conductive traces exposed at the front surface 901F of the patterned conductive layer 901, and subsequently, encapsulated by the second encapsulant layer 903B'. As shown in FIG. 10E, the second encapsulant layer 903B' covers the semiconductor chip 902, the front surface 901F of the patterned conductive layer 901, and the first encapsulant layer 903A'. FIG. 10F is a planarization or thinning operation where the first encapsulant layer 903A' is planarized or thinned down to expose the first portion 905A of the conductive element, or forming a coplanar surface composed of the first encapsulant 903A and the first portion 905A of the conductive element. The second encapsulant layer 903B' may optionally be thinned at current operation or previous operation to obtain the second encapsulant 903B with desired thickness. In FIG. 10G, a second portion 905B of the conductive element, such as a solder ball or solder bump, is connected to the first portion 905A, electrically connected to the patterned conductive layer 901 and the semiconductor chip 902.

10CA, FIG. 10CB, FIG. 10CC, FIG. 10CD are cross sections of a CSP 90A during intermediate manufacturing operations, in accordance with some embodiments of the present disclosure. In FIG. 10CA, with the mechanical support of the first encapsulant layer 903A', probing holes 9030 can be opened with the alignment to the first portion 905A of the conductive element 905, following operation in FIG. 10C. The probing holes 9030 can be formed by various technique including, but not limited to the technique described in FIG. 7D. FIG. 10CB is a de-carrier operation where the carrier 1000 can be detached from the patterned conductive layer 901. In FIG. 10CC, the continuous conductive layer 9011' can be removed by a flash etching operation. In FIG. 10CD, testing probe 1010B can approach the first portion 905A of the conductive element 905 from the back surface 901B to perform various electrical testing. Similarly, testing probe 1010F can approach the first conductive layer 9011 of the conductive 2-layer embedded trace structure from the front surface 901F to perform various electrical testing. In some embodiments, performing the electrical testing using testing probe 1010B and testing probe 1010F simultaneously can provide early screening of bad patterned conductive layer units and further reduce die loss rate after package assembly.

In a 1-layer embedded trace structure, optical inspection is used for early screening of bad patterned conductive layer unit. However, in a 2- or more-layer embedded trace structure, current disclosure allows electrical testing to be performed at early stage of thin substrate fabrication (e.g., substrate thinner than 100 μm). With the formation of the first encapsulant layer 903A' over the carrier 1000, subsequent handling of the thin substrate can be solely supported by the first encapsulant layer 903A' and avoid the application of a second carrier, as described in the comparative embodiments in FIG. 2A to FIG. 2E.

FIG. 11A shows a cross section of the semiconductor substrate 110A of FIG. 10B, and FIG. 11B shows a cross section of the semiconductor substrate 110B of FIG. 10C ready for singulation, in accordance with some embodiments of the present disclosure. As previously described, the plurality of patterned conductive layer units 1100A, 1100B, 1100C are formed on the carrier 1000 prior to the singulation operation, as shown in FIG. 11A. Subsequently, the first encapsulant layer 903A' is formed over the plurality of patterned conductive layer units 1100A, 1100B, 1100C, filling gaps 1100AB and 1100BC between adjacent patterned conductive layer units. The semiconductor substrate 110B is then die sawed into a plurality of singulated substrate chips for subsequent packaging operations. Each of the singulated substrate chips having a side surface 901S covered by the first encapsulant layer 903A', as illustrated in FIG. 10C.

FIG. 12A to FIG. 12E show cross sections of the CSP 90A of FIG. 9A during intermediate manufacturing operations, in accordance with some embodiments of the present disclosure. In FIG. 12A, a patterned conductive layer 901, for example, a 2-layer embedded trace structure, is formed on a carrier 1200. The patterned conductive layer 901 has a front surface 901F in contact with the carrier 1200 and a back surface 901B opposite to the front surface 901F. A side surface 901S of the patterned conductive layer 901 connects the front surface 901F and the back surface 901B. A continuous conductive layer 9011' covers the top surface of the carrier 1000 and connects individual pattern of the first conductive layer 9011. In FIG. 12B, the first encapsulant layer 903A' is formed to cover the back surface 901B and the side surface 901S of the patterned conductive layer 901. A plurality of patterned conductive layer units can be formed on the carrier 1200 up to the operation in FIG. 12B prior to a singulation operation, as will be discussed in FIG. 13A and FIG. 13B.

Figure 12D:
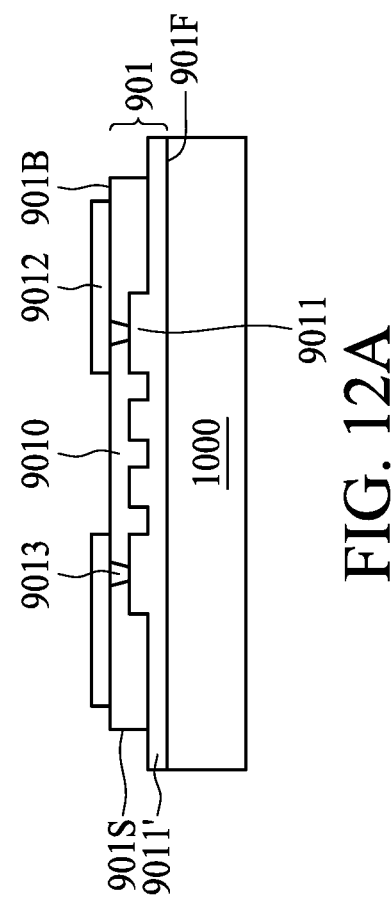
Figure 12C:
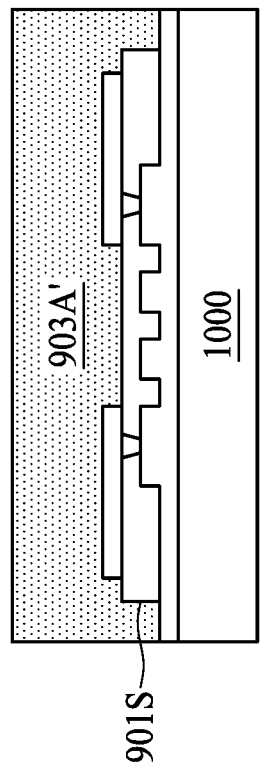
Figure 12E:
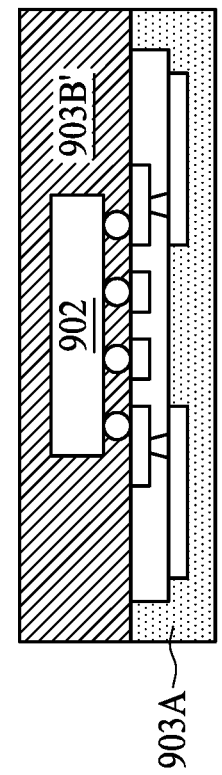

FIG. 12C shows a de-carrier operation where the carrier 1200 is detached from the patterned conductive layer 901 and the first encapsulant layer 903A' and exposing the front surface 901F of the patterned conductive layer 901. The continuous conductive layer 9011' is removed in current operation by a flash etching operation. A semiconductor chip 902 is flip-chip bonded to the conductive traces exposed at the front surface 901F of the patterned conductive layer 901, and subsequently, encapsulated by the second encapsulant layer 903B'. As shown in FIG. 12C, the second encapsulant layer 903B' covers the semiconductor chip 902, the front surface 901F of the patterned conductive layer 901, and the first encapsulant layer 903A'. The first encapsulant layer 903A' may be thinned down to a desired thickness to obtain the first encapsulant 903A in current or previous operation. In FIG. 12D, a portion of the first encapsulant 903A is removed to expose a portion of the second conductive layer 9012. Removing the first encapsulant 903A form an opening 903C in the first encapsulant 903A with alignment to the conductive traces of the second conductive layer 9012. A solder paste or solder ball is disposed in the opening 903C and filling the opening with proper reflowing operation to form a conductive element 905 protruding from the bottom surface of the first encapsulant 903A.

FIG. 13A shows a cross section of the semiconductor substrate 130A of FIG. 12A, and FIG. 13B shows a cross section of the semiconductor substrate 130B of FIG. 12B ready for singulation, in accordance with some embodiments of the present disclosure. As previously described, the plurality of patterned conductive layer units 1300A, 1300B, 1300C are formed on the carrier 1200 prior to the singulation operation, as shown in FIG. 13A. Subsequently, the first encapsulant layer 903A' is formed over the plurality of patterned conductive layer units 1300A, 1300B, 1300C, filling gaps 1300AB and 1300BC between adjacent patterned conductive layer units. The semiconductor substrate 130B is then die sawed into a plurality of singulated substrate chips for subsequent packaging operations. Each of the singulated substrate chips having a side surface 901S covered by the first encapsulant layer 903A', as illustrated in FIG. 12B.

FIG. 14A to FIG. 14F show cross sections of the LGA package 90B of FIG. 9B during intermediate manufacturing operations, in accordance with some embodiments of the present disclosure. In FIG. 14A, a patterned conductive layer 901, for example, a 2-layer embedded trace structure, is formed on a carrier 1400. The patterned conductive layer 901 has a front surface 901F in contact with the carrier 1400 and a back surface 901B opposite to the front surface 901F. A side surface 901S of the patterned conductive layer 901 connects the front surface 901F and the back surface 901B. A solder resist layer 9010' is patterned with openings over the second conductive layer 9012 of the patterned conductive layer 901. In FIG. 14B, a solder ball or solder paste is disposed at the opening exposing the second conductive layer 9012, followed by a proper reflow operation to form conductive element 905. The conductive element 905 may protrude from the solder resist layer 9010'. In FIG. 14C, the first encapsulant layer 903A' is formed to cover the back surface 901B and the side surface 901S of the patterned conductive layer 901. A plurality of patterned conductive layer units can be formed on the carrier 1400 up to the operation in FIG. 14C prior to a singulation operation, as will be discussed in FIG. 15A and FIG. 15B.

FIG. 14D shows a de-carrier operation where the carrier 1400 is detached from the patterned conductive layer 901 and the first encapsulant layer 903A' and exposing the front surface 901F of the patterned conductive layer 901. A semiconductor chip 902 is flip-chip bonded to the conductive traces exposed at the front surface 901F of the patterned conductive layer 901, and subsequently, encapsulated by the second encapsulant layer 903B'. As shown in FIG. 14E, the second encapsulant layer 903B' covers the semiconductor chip 902, the front surface 901F of the patterned conductive layer 901, and the first encapsulant layer 903A'. The first encapsulant layer 903A' is then thinned down to a desired thickness to obtain the first encapsulant 903A in current operation to expose the conductive element 905 from the first encapsulant 903A, as shown in FIG. 14F. In some embodiments, the bottom surface of the first encapsulant 903A and the exposed surface of the conductive element 905 are coplanar.

FIG. 15A shows a cross section of the semiconductor substrate 150A of FIG. 14B and FIG. 15B shows a cross section of the semiconductor substrate 150B of FIG. 14C ready for singulation, in accordance with some embodiments of the present disclosure. As previously described, the plurality of patterned conductive layer units 1500A, 1500B, 1500C are formed on the carrier 1400 prior to the singulation operation, as shown in FIG. 15A. Subsequently, the first encapsulant layer 903A' is formed over the plurality of patterned conductive layer units 1500A, 1500B, 1500C, filling gaps 1500AB and 1500BC between adjacent patterned conductive layer units. The semiconductor substrate 150B is then die sawed into a plurality of singulated substrate chips for subsequent packaging operations. Each of the singulated substrate chips having a side surface 901S covered by the first encapsulant layer 903A', and a side surface of the solder resist layer 9010' is also covered by the first encapsulant layer 903A', as illustrated in FIG. 14C.

FIG. 16A, FIG. 16B, and FIG. 16C show cross sections of chip scale packages (CSP) 160A, 160B, 160C, having a 2-layer embedded trace substrate (ETS) integrated with passive devices. In FIG. 16A, a passive device 907 such as a resistor, a capacitor, or an inductor, is disposed at the back surface 901B of the patterned conductive layer 901 and encapsulated by the first encapsulant 903A. The passive device 907 can be integrated to the patterned conductive layer 901 at the operation, for example, shown in FIG. 14B of current application and electrically connected to the semiconductor chip 902 through the patterned conductive layer 901.

In FIG. 16B, multiple passive devices 907 are disclosed at the front surface 901F of the patterned conductive layer 901 and encapsulated by the second encapsulant 903B. An additional semiconductor chip 908 is flip-chip bonded to the back surface 901B, encapsulated by the first encapsulant 903A, and electrically coupled to the conductive traces in the patterned conductive layer 901. The multiple passive devices 907 can be integrated to the patterned conductive layer 901 at the operation, for example, shown in FIG. 14E of current application. The additional semiconductor chip 908 can be integrated to the patterned conductive layer 901 at the operation, for example, shown in FIG. 14B of current application. The CSP 160C in FIG. 16C is similar to the CSP 160B in FIG. 16B except that the additional semiconductor chip 908 is wire-bonded to the back surface 901B, encapsulated by the first encapsulant 903A, and electrically coupled to the conductive traces in the patterned conductive layer 901.

Referring to FIG. 17A, FIG. 17A shows a cross section of a chip scale package (CSP) having a 1-layer molded interconnect substrate (MIS), in accordance with some embodiments of the present disclosure. The CSP 170A includes a patterned conductive layer 1701, for example, a 1-layer conductive trace embedded in the first encapsulant 1703A. Optionally, a solder resist layer 1701A' is disposed on the conductive trance 1701A. The patterned conductive layer 1701 has a front surface 1701F and a back surface 1701B opposite to the front surface 1701F. The front surface 1701F is closer to a semiconductor chip 1702 than the back surface 1701B. In some embodiments, the front surface 1701F exposes a portion of the embedded trace in order to form electrical connection between the patterned conductive layer 1701 and the semiconductor chip 1702.

The CSP 170A further includes a first encapsulant 1703A positioned at the back surface 1701B of the patterned conductive layer 1701. As shown in FIG. 17A, the first encapsulant 1703A covers the back surface 1701B and a side surface 1701S of the patterned conductive layer 1701. The CSP 170A further includes a second encapsulant 1703B positioned at the front surface 1701F of the patterned conductive layer 1701. The second encapsulant 1703B covering the top, the side, and the bottom of the semiconductor chip 1702, as well as the front surface 1701F of the patterned conductive layer 1701. At the edge of the CSP 170A, the first encapsulant 1703A and the second encapsulant 1703B are in direct contact and a boundary between the two encapsulants can be observed. For example, a horizontal boundary substantially leveling with the front surface 1701F of the patterned conductive layer 1701 can be observed in the CSP 170A.

The CSP 170A of FIG. 17A further includes a conductive element 1705 positioned at the back surface 1701B of the patterned conductive layer 1701 and electrically connected to the conductive traces 1701A in the patterned conductive layer 1701. In some embodiments, the conductive element 1705 is partially surrounded by the first encapsulant 1703A. For example as depicted in FIG. 3A, the conductive element 305 is partially surrounded by and partially protruding from the first encapsulant 1703A.

The first encapsulant 1703A of the CSP 170A can be composed of epoxy and filler for heat conduction enhancement. The filler can be in spherical shape or pillar shape. In some embodiments, an incomplete filler, for example, fillers in broken sphere or broken pillar shape, can be observed at the bottom surface of the first encapsulant 1703A, as a result of planarization operation at such bottom surface. The first encapsulant 303A may be selected from dielectric materials having a Young's modulus greater than or equal to 15 GPa to provide sufficient mechanical support to the patterned conductive layer 1701 during its fabrication and handling.

The second encapsulant 1703B may be composed of the same of different materials as the first encapsulant 1703A. For example, the second encapsulant 1703B may or may not be composed of epoxy and filler, incomplete fillers. The second encapsulant 1703B may or may not have a Young's modulus greater than or equal to 15 GPa.

FIG. 17B shows a land grid array (LGA) package 170B having a 1-layer molded interconnect substrate (MIS), in accordance with some embodiments of the present disclosure. Identical numerical label in FIG. 17B and FIG. 17A indicates similar element or its equivalent and is not repeated here for brevity. The conductive element 1705 in the LGA package 170B can be composed of a solder pillar laterally surrounded by the first encapsulant 1703A. The bottom of the solder pillar may be coplanar with the bottom surface of the first encapsulant 1703A.

FIG. 18A to FIG. 18G show cross sections of the CSP 170A of FIG. 17A and the LGA package 170B of FIG. 17B during intermediate manufacturing operations, in accordance with some embodiments of the present disclosure. In FIG. 18A, a patterned conductive layer 1701, for example, a 1-layer conductive trace 1701A and optionally a solder resist layer 1701A', are formed on a carrier 1800. A patterned solder resist layer 1701A' having openings is disposed over the conductive trace 1701A. The patterned conductive layer 1701 has a front surface 1701F in contact with the carrier 1800 and a back surface 1701B opposite to the front surface 1701F. A side surface 1701S of the patterned conductive layer 1701 connects the front surface 1701F and the back surface 1701B. In FIG. 18B, a conductive element 1705 such as a solder ball or a solder paste, is connected to the conductive traces 1701A through the opening previously exposed from the solder resist layer 1701A'. In other embodiments not shown in FIG. 18B, the conductive element 1705 can be copper pillar or solder pillar, as previously described in FIG. 10B. The conductive element 1705 protrudes from the back surface 1701B of the patterned conductive layer 1701. The first encapsulant layer 1703A' is formed to cover the conductive element 1705, the back surface 1701B, and the side surface 1701S of the patterned conductive layer 1701, as shown in FIG. 18C. The conductive trace 1701A and the first encapsulant layer 1703A' together form a molded interconnect substrate (MIS). A plurality of patterned conductive layer units can be formed on the carrier 1800 up to the operation in FIG. 18C prior to a singulation operation, as will be discussed in FIG. 19A and FIG. 19B.

FIG. 18D shows a de-carrier operation where the carrier 1800 is detached from the patterned conductive layer 1701 and the first encapsulant layer 1703A' and exposing the front surface 1701F of the patterned conductive layer 1701. A semiconductor chip 1702 is flip-chip bonded to the conductive traces exposed at the front surface 1701F of the patterned conductive layer 1701, and subsequently, encapsulated by the second encapsulant layer 17033. As shown in FIG. 18E, the second encapsulant layer 1703B' covers the semiconductor chip 1702, the front surface 1701F of the patterned conductive layer 1701, and the first encapsulant layer 1703A'. FIG. 18F is a planarization or thinning operation where the first encapsulant layer 1703A' is planarized or thinned down to expose the conductive element 1705, or forming a coplanar surface composed of the first encapsulant 1703A and the conductive element 1705. The second encapsulant layer 1703B' may optionally be thinned at current operation or previous operation to obtain the second encapsulant 1703B with desired thickness. A LGA package having a 1-layer MIS is formed in FIG. 18F. Alternatively, in FIG. 18G, a conductive element 1705 can be a solder ball connected to the conductive trace 1701A in the MIS through a laser-drilled opening in the first encapsulant 1703A, as can be referred to previously described FIG. 12D and FIG. 12E. A CSP having a 1-layer MIS is formed in FIG. 18G.

FIG. 18AA, FIG. 18BB, FIG. 18CC, FIG. 18DD, FIG. 18EE, FIG. 18FF, and FIG. 18GG show cross sections of a semiconductor package having a 2-layer MIS during intermediate manufacturing operations, in accordance with some embodiments of the present disclosure. In FIG. 18AA, a patterned conductive layer 1801, for example, a 2-layer MIS structure with a first portion 1805A of conductive element 1805 and a first encapsulant layer 1803A' is formed over the carrier 1800. The patterned conductive layer 1801 has a front surface 1801F close to the carrier 1800 and a back surface 1801B away from the carrier. In FIG. 18BB, several testing holes 1801' is formed in the first encapsulant layer 1803A' with the alignment to the conductive trace of the patterned conductive layer 1801 is formed by, but not limited to, the method previously described in FIG. 10CA and can be referred thereto. FIG. 18CC is a de-carrier operation where the carrier 1800 is detached from the patterned conductive layer 1801 and followed by a copper flash etching operation. In FIG. 18DD, testing probe 1810B can approach the first portion 1805A of the conductive element 1805 from the back surface 1801B to perform various electrical testing. Similarly, testing probe 1810F can approach the conductive trace of the MIS from the front surface 1801F to perform various electrical testing. In some embodiments, performing the electrical testing using testing probe 1810B and testing probe 1810F simultaneously can provide early screening of bad MIS units and further reduce die loss rate after package assembly.

In FIG. 18EE, after the electrical testing, a semiconductor chip 1802 is flip chip bonded to the exposed conductive traces of the patterned conductive layer 1801 from the front surface 1801F. A second encapsulant layer 1803B' covers the semiconductor chip 1802, the front surface 1801F of the patterned conductive layer 1801, and the first encapsulant layer 1803A'. FIG. 18FF is a planarization or thinning operation where the first encapsulant layer 1803A' is planarized or thinned down to expose the first portion 1805A of the conductive element 1805, or forming a coplanar surface composed of the first encapsulant 1803A and the first portion 1805A of the conductive element 1805. The second encapsulant layer 1803B' may optionally be thinned at current operation or previous operation to obtain the second encapsulant 1803B with desired thickness. In FIG. 18GG, a second portion 1805B of the conductive element 1805, for example a solder ball, can be positioned with alignment to the first portion 1805A of the conductive element 1805. A CSP having a 2-layer patterned conductive layer 1801 can be obtained in FIG. 18GG.

FIG. 18AA', FIG. 18BB', FIG. 18CC', and FIG. 18DD' show cross sections of a semiconductor package having a 2-layer resin-coated-copper (RCC) embedded trace substrate (ETS) during intermediate manufacturing operations, in accordance with some embodiments of the present disclosure. FIG. 18AA', FIG. 18BB', FIG. 18CC', and FIG. 18DD' are similar to FIG. 18AA, FIG. 18BB, FIG. 18CC, and FIG. 18DD except that the patterned conductive layer 1801 is composed of a 2-layer RCC ETS. A first portion 1805A of the conductive element 1805 is formed over the patterned conductive layer 1801 and also being encapsulated by the first encapsulant 1803A', for example, RCC dielectric. Due to the fact that the RCC dielectric may not be fiberglass reinforced, a copper layer 1804A' is coated over the RCC dielectric to enhance the robustness of the RCC dielectric. In FIG. 18BB', several testing holes 1801' are formed in the first encapsulant layer 1803A' with the alignment to the conductive trace of the patterned conductive layer 1801 by, but not limited to, the method previously described in FIG. 10CA and can be referred thereto. FIG. 18CC' is a de-carrier operation where the carrier 1800 is detached from the patterned conductive layer 1801 and followed by a copper flash etching operation. In FIG. 18DD', testing probe 1810B can approach the first portion 1805A of the conductive element 1805 from the back surface 1801B to perform various electrical testing. Similarly, testing probe 1810F can approach the conductive trace of the patterned conductive layer 1801 from the front surface 1801F to perform various electrical testing. In some embodiments, performing the electrical testing using testing probe 1810B and testing probe 1810F simultaneously can provide early screening of bad RCC ETS units and further reduce die loss rate after package assembly.

FIG. 18AA", FIG. 18BB", FIG. 18CC", and FIG. 18DD" show cross sections of a semiconductor package having a 2-layer printable dielectric ETS during intermediate manufacturing operations, in accordance with some embodiments of the present disclosure. FIG. 18AA", FIG. 18BB", FIG. 18CC", and FIG. 18DD" are similar to FIG. 18AA, FIG. 18BB, FIG. 18CC, and FIG. 18DD except that the patterned conductive layer 1801 is composed of a 2-layer ETS. A first portion 1805A of the conductive element 1805 is formed over the patterned conductive layer 1801 and also being encapsulated by the first encapsulant 1803A', for example, printable dielectric. As shown in FIG. 18AA", the printable dielectric has a conformal surface following the underlying morphology of the conductive element and the patterned conductive layer 1801. In FIG. 18BB", several testing holes 1801' are formed in the first encapsulant layer 1803A' with the alignment to the conductive trace of the patterned conductive layer 1801 by, but not limited to, the method previously described in FIG. 10CA and can be referred thereto. FIG. 18CC" is a de-carrier operation where the carrier 1800 is detached from the patterned conductive layer 1801 and followed by a copper flash etching operation. In FIG. 18DD', testing probe 1810B can approach the first portion 1805A of the conductive element from the back surface 1801B to perform various electrical testing. Similarly, testing probe 1810F can approach the conductive trace of the patterned conductive layer 1801 from the front surface 1801F to perform various electrical testing. In some embodiments, performing the electrical testing using testing probe 1810B and testing probe 1810F simultaneously can provide early screening of bad ETS units and further reduce die loss rate after package assembly.

FIG. 19A shows a cross section of the semiconductor substrate 190A of FIG. 18B, and FIG. 19B shows a cross section of the semiconductor substrate 190B of FIG. 18C ready for singulation, in accordance with some embodiments of the present disclosure. As previously described, the plurality of patterned conductive layer units 1900A, 1900B, 1900C are formed on the carrier 1800 prior to the singulation operation, as shown in FIG. 19A. Subsequently, the first encapsulant layer 1703A' is formed over the plurality of patterned conductive layer units 1900A, 1900B, 1900C, filling gaps 1900AB and 1900BC between adjacent patterned conductive layer units. The semiconductor substrate 190B is then die sawed into a plurality of singulated substrate chips for subsequent packaging operations. Each of the singulated substrate chips having a side surface 1701S covered by the first encapsulant layer 1703A', as illustrated in FIG. 18C.

FIG. 20A shows a cross section of a core semiconductor package 200A having a vertical molding boundary, in accordance with some embodiments of the present disclosure. The core semiconductor package 200A includes a core substrate 2001 with a front surface 2001F and a back surface 2001B. The core substrate 2001 may be an organic substrate formed from a core layer made of fiberglass reinforced BT (bismaleimide-triazine) resin or FR-4 fiberglass reinforced epoxy resin. In some embodiments, the front surface 2001F exposes a portion of the embedded trace in order to form electrical connection between the core substrate 2001 and the semiconductor chip 2002. The core semiconductor package 200A further includes a first encapsulant 2003A positioned at the back surface 2001B of the core substrate 2001. As shown in FIG. 20A, the first encapsulant 2003A covers the back surface 2001B of the core substrate 2001, and the second encapsulant 2003B covers the front surface 2001F and the side surface 2001S of the core substrate 2001. Since the side surface 2001S of the patterned conductive layer 301 may be composed of organic dielectric material with high hygroscopicity, coverage of the second encapsulant 2003B at the side surface 2001S may lower the water adsorption rate at the organic dielectric material and prevent the core substrate 2001 from degradation. The second encapsulant 2003B covering the top, the side, and the bottom of the semiconductor chip 2002, as well as the front surface 2001F of the core substrate 2001. At the edge of the core semiconductor package 200A, the first encapsulant 2003A and the second encapsulant 2003B are in direct contact and a boundary between the two encapsulants can be observed. For example, a vertical boundary 2003AB substantially aligning with the side surface 2001S of the core substrate 2001 can be observed in the core semiconductor package 200A.

FIG. 20B shows a cross section of a core semiconductor package 200B having a horizontal molding boundary, in accordance with some embodiments of the present disclosure. The core semiconductor package 200B is similar to the core semiconductor package 200A except that the first encapsulant 2003A covers the back surface 2001B and the side surface 2001S of the core substrate 2001, whereas the second encapsulant 2003B covers top surface 2001F of the core substrate 2001 and an edge portion of the first encapsulant 2003A. At the edge of the core semiconductor package 200B, the first encapsulant 2003A and the second encapsulant 2003B are in direct contact and a boundary between the two encapsulants can be observed. For example, a horizontal boundary 2003AB substantially leveling with the front surface 2001F of the core substrate 2001 can be observed in the core semiconductor package 200B.

Figure 21A:
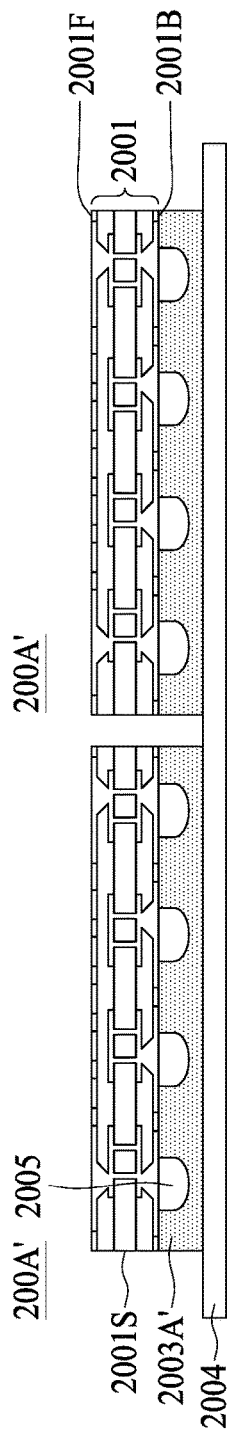
Figure 21B:
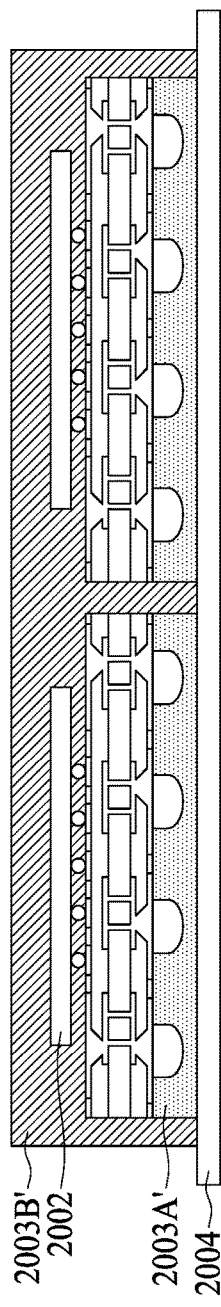
Figure 21C:
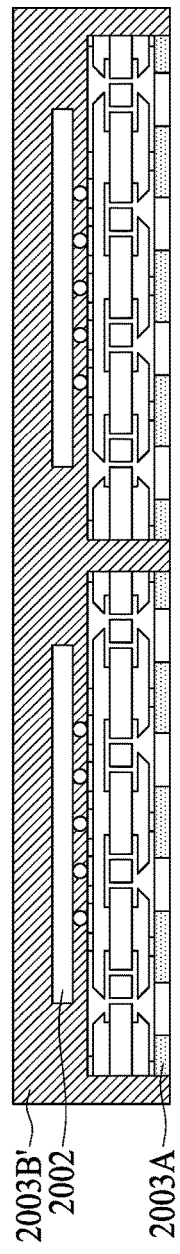
Figure 21D:
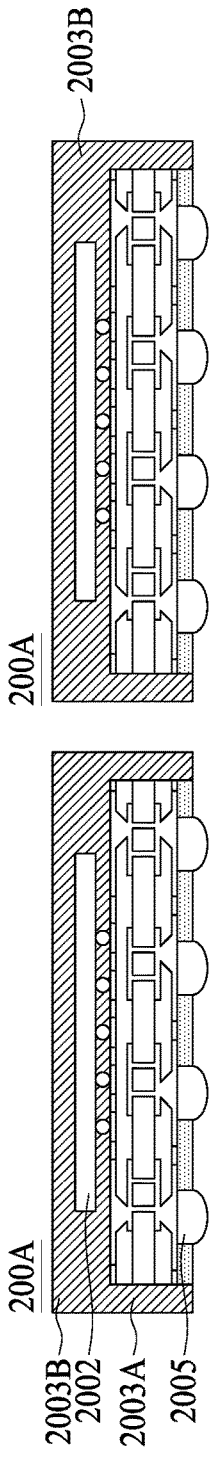

FIG. 21A to FIG. 21D show cross sections of the core semiconductor package 200A of FIG. 20A during intermediate manufacturing operations, in accordance with some embodiments of the present disclosure. In FIG. 21A, known good substrates 200A' attached to the first encapsulant layer 2003A' at the back surface 2001B are picked and placed over a tape 2004. In some embodiments, the conductive element 2005 at the back surface 2001B of the core substrate 200 is pressed into the first encapsulant layer 2003A'. Operation shown in FIG. 21A is a substrate reconstitution operation. In FIG. 21B, the semiconductor chip 2002 is flip chip bonded to the front surface 2001F of the core substrate 2001, subsequently, the second encapsulant layer 2003B' is formed to encapsulate the front surface 2001F and the side surface 2001S of the core substrate 2001 by filling in gaps between adjacent known good substrates 200A'. In FIG. 21C, the tape 2004 is removed from the first encapsulant layer 2003A' and a thinning operation is performed to thin down the first encapsulant layer 2003A' to a desired thickness. In some embodiments, the conductive element 2005 is exposed from the first encapsulant layer 2003A' after the thinning operation. In FIG. 21D, a solder ball is attached to the exposed conductive element 2005 and forming a ball grid array at the back surface 2001B of the core substrate 2001. A die saw operation is then performed to singulate the semiconductor package into a plurality of core semiconductor packages 200A, as shown in FIG. 20A.

Figure 22A:
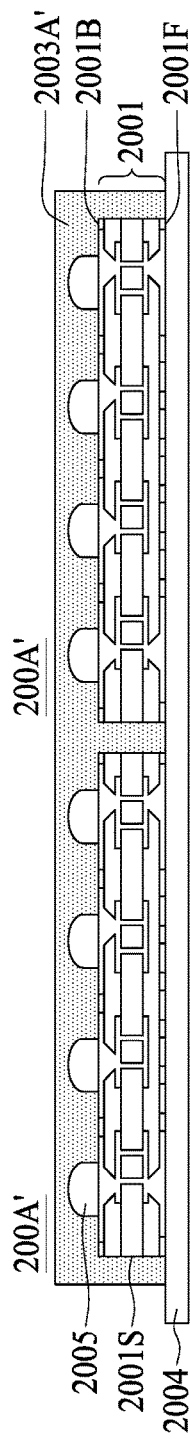
Figure 22B:
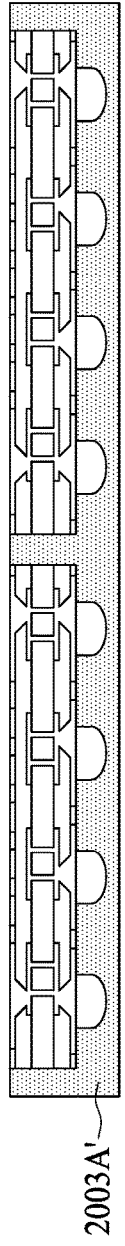
Figure 22C:
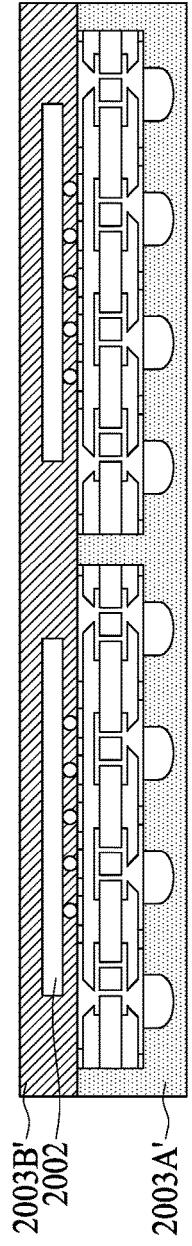
Figure 22D:
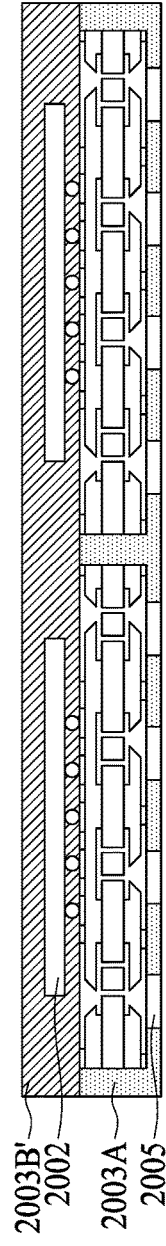
Figure 22E:
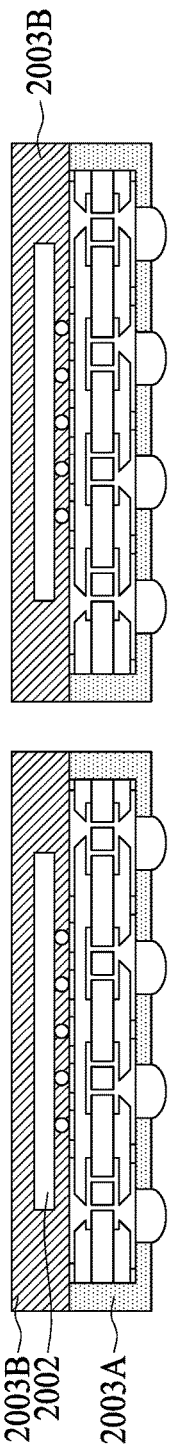
Figure 23A:
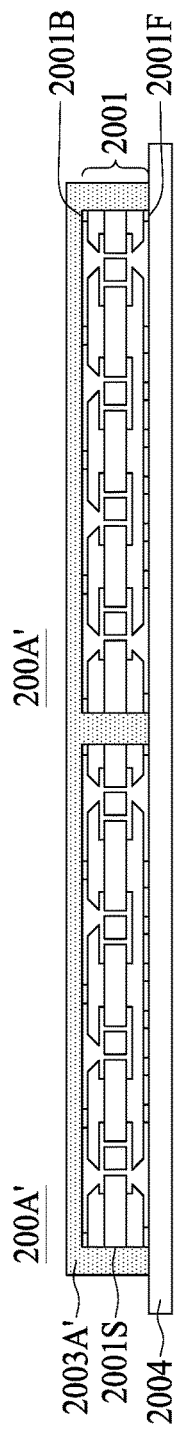

FIG. 22A to FIG. 22E show cross sections of the core semiconductor package 200B of FIG. 20B during intermediate manufacturing operations, in accordance with some embodiments of the present disclosure. In FIG. 23A, known good substrates 200A' are attached to the tape 2004 at the front surface 2001F by a pick and place operation. The known good substrates 200A' are then molded with a first encapsulant layer 2003A'. The first encapsulant layer 2003A' covers the back surface 2001B and the side surface 2001S of the core substrate 2001. Operation shown in FIG. 22A is a substrate reconstitution operation. In FIG. 22B, the tape 2004 is removed from the molded substrate. In FIG. 22C, the semiconductor chip 2002 is flip chip bonded to the front surface 2001F of the core substrate 2001, subsequently, the second encapsulant layer 2003B' is formed to encapsulate the front surface 2001F of the core substrate 2001 and the semiconductor chips 2002. In FIG. 22D, a thinning operation is performed to thin down the first encapsulant layer 2003A' to a desired thickness. In some embodiments, the conductive element 2005 is exposed from the first encapsulant layer 2003A' after the thinning operation. In FIG. 22E, a solder ball is attached to the exposed conductive element 2005 and forming a ball grid array at the back surface 2001B of the core substrate 2001. A die saw operation is then performed to singulate the semiconductor package into a plurality of core semiconductor packages 200B, as shown in FIG. 20B.

Figure 23B:
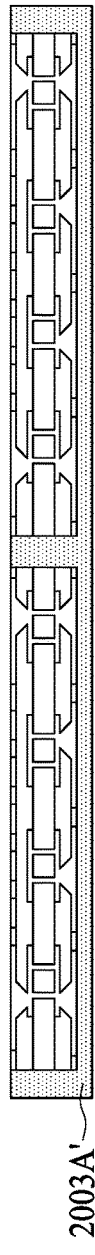
Figure 23C:
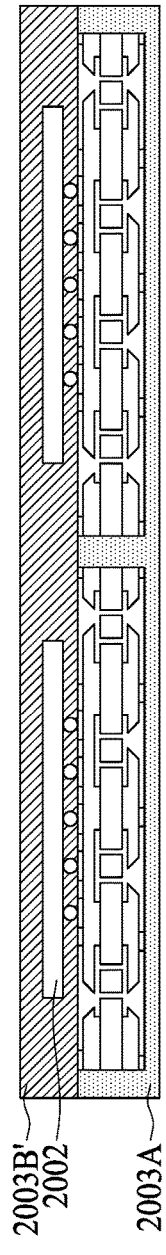
Figure 23D:
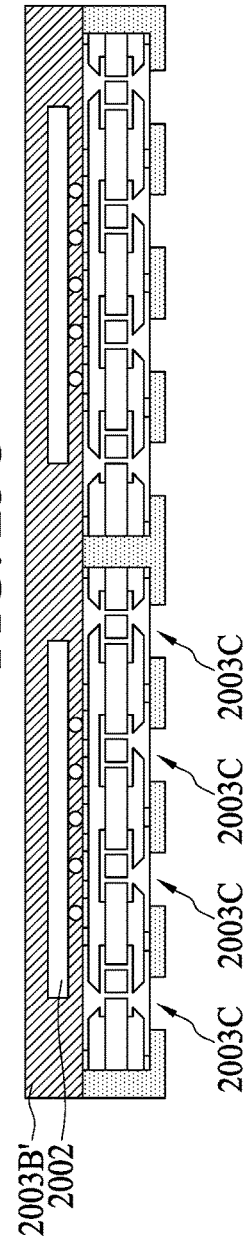
Figure 23E:
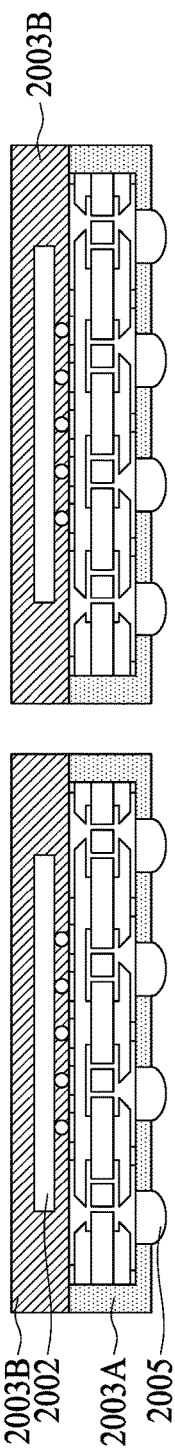

FIG. 23A to FIG. 23E show cross sections of the core semiconductor package 200B of FIG. 20B during intermediate manufacturing operations, in accordance with some embodiments of the present disclosure. In FIG. 23A, known good substrates 200A' are attached to the a tape 2004 at the front surface 2001F by a pick and place operation. The known good substrates 200A' are then molded with a first encapsulant layer 2003A'. The first encapsulant layer 2003A' covers the back surface 2001B and the side surface 2001S of the core substrate 2001. Operation shown in FIG. 23A is a substrate reconstitution operation. In FIG. 23B, the tape 2004 is removed from the molded substrate. A thinning operation may be performed in current stage of the next stage to thin down the first encapsulant layer 2003A' to a desired thickness. In FIG. 23C, the semiconductor chip 2002 is flip chip bonded to the front surface 2001F of the core substrate 2001, subsequently, the second encapsulant layer 2003B' is formed to encapsulate the front surface 2001F of the core substrate 2001 and the semiconductor chips 2002. In FIG. 23D, a plurality of openings are formed in the first encapsulant 2003A with the alignment of the conductive traces on the core substrate 2001. In FIG. 23E, a solder ball or solder paste is disposed in the openings 2003C and forming a ball grid array at the back surface 2001B of the core substrate 2001 with proper reflow operation. A die saw operation is then performed to singulate the semiconductor package into a plurality of core semiconductor packages 200B, as shown in FIG. 20B.

Embodiments of the present disclosure are discussed in detail above. It should be appreciated, however, that the present disclosure provides many applicable concepts that can be embodied in a wide variety of specific contexts. The specific embodiments discussed are merely illustrative and do not limit the scope of the disclosure.

Further, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (e.g., rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints, unless specified otherwise. The term "substantially coplanar" can refer to two surfaces within micrometers (μm) of lying along a same plane, such as within 10 within 5 within 1 or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor package structure, comprising:
    a patterned conductive layer, having a front surface, a back surface, and a side surface connecting the front surface and the back surface, wherein the patterned conductive layer includes a dielectric layer and a conductive trace embedded in the dielectric layer;
    a first semiconductor chip on the front surface and electrically connected to the patterned conductive layer;
    a first encapsulant covering at least the back surface of the patterned conductive layer; and
    a second encapsulant covering at least the front surface of the patterned conductive layer, the dielectric layer being covered by one of the first encapsulant and the second encapsulant.

2. The semiconductor package structure of claim 1, wherein the first encapsulant comprises epoxy and fillers.

3. The semiconductor package structure of claim 1, further comprising a conductive element on the back surface of the patterned conductive layer and being surrounded by the first encapsulant.

4. The semiconductor package structure of claim 3, wherein the conductive element comprises a first portion surrounded by the first encapsulant and a second portion protruding from the first encapsulant.

5. The semiconductor package structure of claim 4, wherein the first portion is substantially coplanar with the first encapsulant.

6. The semiconductor package structure of claim 4, wherein the first portion comprises a conductive pillar.

7. The semiconductor package structure of claim 1, wherein the first encapsulant covers the back surface and the side surface of the patterned conductive layer.

8. The semiconductor package structure of claim 7, wherein a water absorption rate of the first encapsulant is less than or equal to 0.5%.

9. The semiconductor package structure of claim 7, a Young's modulus of the first encapsulant is greater than or equal to 15 GPa.

10. The semiconductor package structure of claim 1, wherein a boundary interfaces the first encapsulant and the second encapsulant.

11. The semiconductor package structure of claim 1, wherein the patterned conductive layer comprises a core substrate.

12. The semiconductor package structure of claim 1, further comprising a second semiconductor chip on the back surface of the patterned conductive layer and electrically connected to the patterned conductive layer.

13. The semiconductor package structure of claim 1, wherein the patterned conductive layer comprises a plurality of conductive traces.

14. The semiconductor package structure of claim 13, wherein at least one of the conductive traces comprises a first sub-layer, a second sub-layer, and a conductive via electrically connecting the first sub-layer and the second sub-layer.

15. The semiconductor package structure of claim 1, wherein the first encapsulant and the second encapsulant comprise different materials.

16. A semiconductor substrate, comprising:
    a patterned conductive layer, having a front surface, a back surface, and a side surface connecting the front surface and the back surface, wherein the patterned conductive layer includes a dielectric layer and a conductive trace embedded in the dielectric layer; and
    an encapsulant covering the back surface and the dielectric layer of the patterned conductive layer.

17. The semiconductor substrate of claim 16, wherein the patterned conductive layer comprise a first conductive layer, a second conductive layer, and a conductive via electrically connecting the first conductive layer and the second conductive layer.

18. The semiconductor substrate of claim 16, wherein the patterned conductive layer comprises a core substrate.

19. The semiconductor substrate of claim 16, further comprising a solder resist layer over the patterned conductive layer.

20. The semiconductor substrate of claim 16, further comprising a plurality of dielectric units, and the encapsulant filling a gap between adjacent dielectric units.

* * * * *